(12) United States Patent
Chang et al.

(10) Patent No.: US 12,278,208 B2
(45) Date of Patent: *Apr. 15, 2025

(54) METHOD OF FABRICATING SEMICONDUCTOR STRUCTURE INCLUDING A BARRIER STRUCTURE IN BETWEEN A PLURALITY OF SURFACE MOUNT COMPONENTS AND A WAFER

(71) Applicant: Taiwan Semiconductor Manufacturing Company, Ltd., Hsinchu (TW)

(72) Inventors: Mao-Yen Chang, Kaohsiung (TW); Chih-Wei Lin, Hsinchu County (TW); Hao-Yi Tsai, Hsinchu (TW); Kuo-Lung Pan, Hsinchu (TW); Chun-Cheng Lin, New Taipei (TW); Tin-Hao Kuo, Hsinchu (TW); Yu-Chia Lai, Miaoli County (TW); Chih-Hsuan Tai, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/499,242

(22) Filed: Nov. 1, 2023

(65) Prior Publication Data
US 2024/0071981 A1  Feb. 29, 2024

Related U.S. Application Data

(63) Continuation of application No. 17/857,035, filed on Jul. 3, 2022, now Pat. No. 11,848,300, which is a
(Continued)

(51) Int. Cl.
*H01L 21/56* (2006.01)
*H01L 23/00* (2006.01)
(Continued)

(52) U.S. Cl.
CPC .............. *H01L 24/73* (2013.01); *H01L 21/568* (2013.01); *H01L 23/5383* (2013.01);
(Continued)

(58) Field of Classification Search
CPC ............... H01L 21/568; H01L 21/6835; H01L 21/4857; H01L 2224/17179;
(Continued)

(56) References Cited

U.S. PATENT DOCUMENTS 9,000,584 B2  4/2015  Lin et al.
9,048,222 B2  6/2015  Hung et al.
(Continued)

*Primary Examiner* — Khiem D Nguyen
(74) *Attorney, Agent, or Firm* — JCIPRNET

(57) ABSTRACT

A method of fabricating a semiconductor structure includes the following steps. A semiconductor wafer is provided. A plurality of first surface mount components and a plurality of second surface mount components are bonded onto the semiconductor wafer, wherein a first portion of each of the second surface mount components is overhanging a periphery of the semiconductor wafer. A first barrier structure is formed in between the second surface mount components and the semiconductor wafer. An underfill structure is formed under a second portion of each of the second surface mount components, wherein the first barrier structure blocks the spreading of the underfill structure from the second portion to the first portion.

20 Claims, 23 Drawing Sheets

Related U.S. Application Data continuation of application No. 17/017,622, filed on Sep. 10, 2020, now Pat. No. 11,424,213.

(51) Int. Cl.
| | | |
|---|---|---|
| *H01L 23/538* | (2006.01) | |
| *H01L 25/00* | (2006.01) | |
| *H01L 25/18* | (2023.01) | |

(52) U.S. Cl.
CPC .............. *H01L 24/16* (2013.01); *H01L 24/32* (2013.01); *H01L 24/81* (2013.01); *H01L 24/83* (2013.01); *H01L 24/92* (2013.01); *H01L 25/18* (2013.01); *H01L 25/50* (2013.01); *H01L 2224/16145* (2013.01); *H01L 2224/17179* (2013.01); *H01L 2224/17517* (2013.01); *H01L 2224/26145* (2013.01); *H01L 2224/32145* (2013.01); *H01L 2224/73204* (2013.01); *H01L 2224/81815* (2013.01); *H01L 2224/83007* (2013.01); *H01L 2224/92125* (2013.01)

(58) Field of Classification Search
CPC . H01L 2224/17517; H01L 2224/26145; H01L 24/16; H01L 24/32; H01L 24/81; H01L 24/83; H01L 24/92

See application file for complete search history.

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,076,881 B2* | 7/2015 | Im | H01L 25/0657 |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,425,180 B2* | 8/2016 | Chang | H01L 23/49811 |
| 9,496,189 B2 | 11/2016 | Yu et al. | |
| 9,935,090 B2* | 4/2018 | Yu | H01L 24/96 |
| 10,290,600 B2* | 5/2019 | Wu | H01L 23/53238 |
| 11,424,213 B2* | 8/2022 | Chang | H01L 21/568 |
| 11,848,300 B2* | 12/2023 | Chang | H01L 24/92 |
| 2013/0168856 A1* | 7/2013 | Wang | H01L 21/563 |
| | | | 257/738 |
| 2018/0308800 A1* | 10/2018 | Tsai | H01L 21/561 |

\* cited by examiner

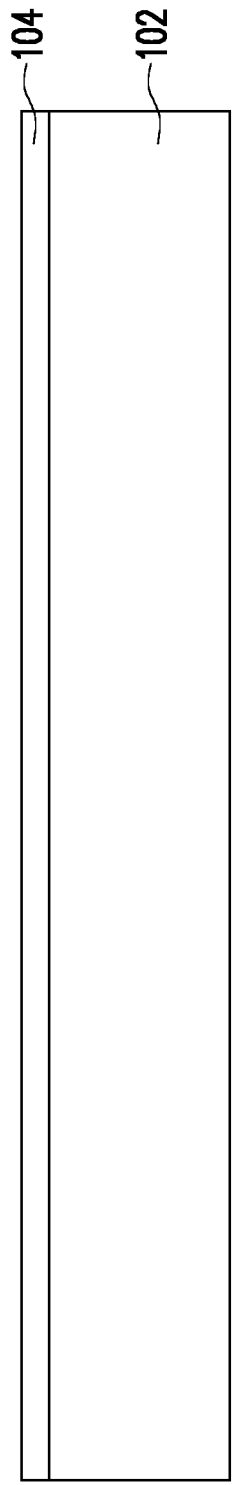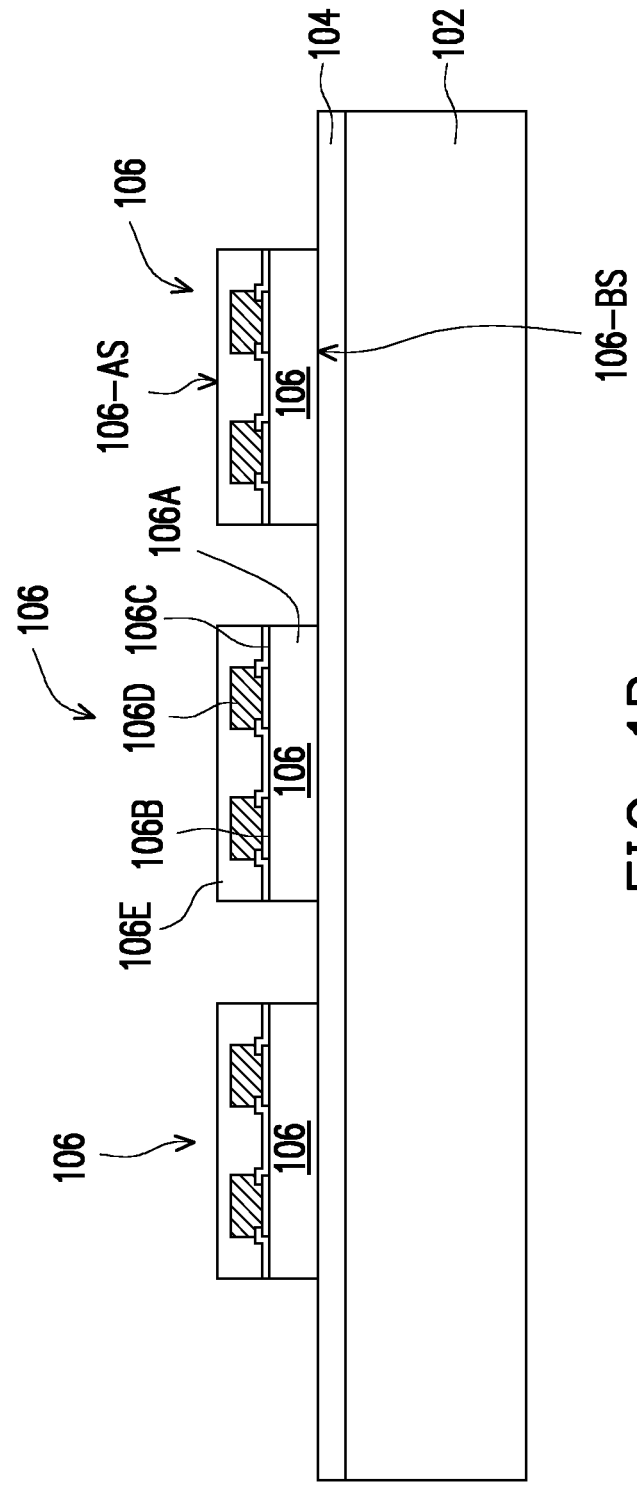

METHOD OF FABRICATING SEMICONDUCTOR STRUCTURE INCLUDING A BARRIER STRUCTURE IN BETWEEN A PLURALITY OF SURFACE MOUNT COMPONENTS AND A WAFER

CROSS-REFERENCE TO RELATED APPLICATION

This application is a continuation application of and claims the priority benefit of a prior application Ser. No. 17/857,035, filed on Jul. 3, 2022, now patented as U.S. Pat. No. 11,848,300, issued on Dec. 19, 2023. The prior application Ser. No. 17/857,035 is a continuation application of and claims the priority benefit of a prior application Ser. No. 17/017,622, filed on Sep. 10, 2020, now patented as U.S. Pat. No. 11,424,213, issued on Aug. 23, 2022. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1A to FIG. 1L are schematic sectional and top views of various stages in a method of fabricating a semiconductor structure according to some exemplary embodiments of the present disclosure.

DETAILED DESCRIPTION

Figure 1C:
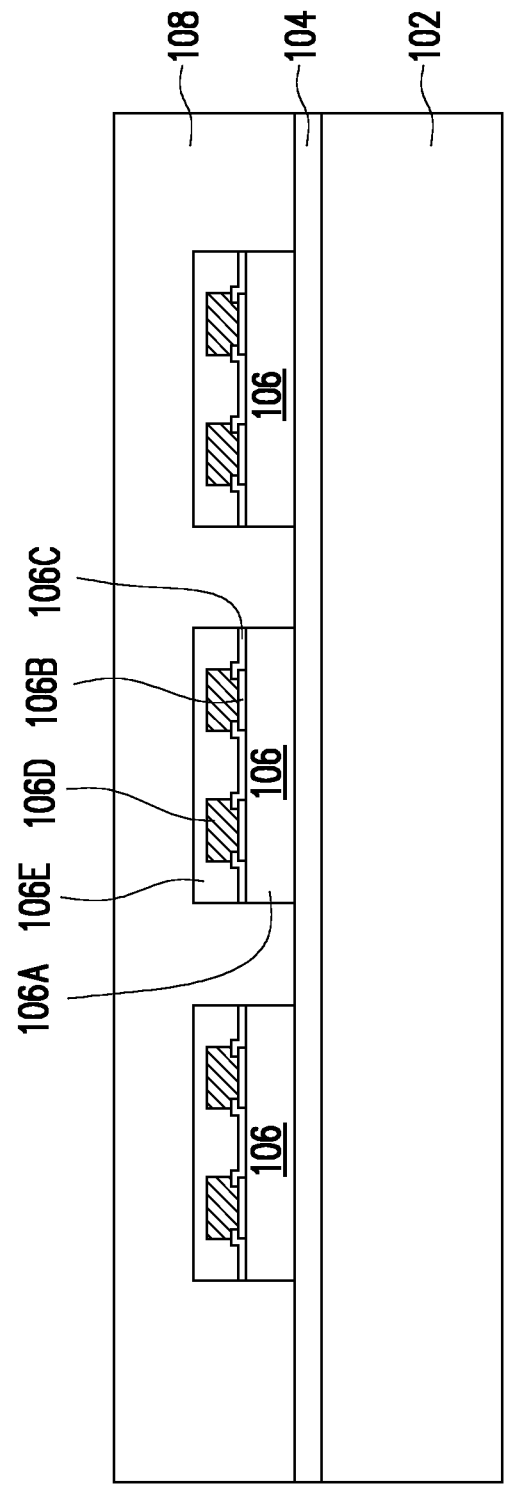

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic sectional and top views of various stages in a method of fabricating a semiconductor structure according to some exemplary embodiments of the present disclosure. Referring to FIG. 1A, a carrier 102 is provided. In some embodiments, the carrier 102 is a glass carrier or any suitable carrier for carrying a semiconductor wafer or a reconstituted wafer used in the method of fabricating the semiconductor structure. In some embodiments, the carrier 102 is coated with a debond layer 104. The material of the debond layer 104 may be any material suitable for bonding and de-bonding the carrier 102 from the above layer(s) or any wafer(s) disposed thereon.

In some embodiment, the debond layer 104 includes a dielectric material layer made of a dielectric material including any suitable polymer-based dielectric material (such as benzocyclobutene ("BCB"), polybenzoxazole ("PBO")). In an alternative embodiment, the debond layer 104 includes a dielectric material layer made of an epoxy-based thermal-release material, which loses its adhesive property when heated, such as a light-to-heat-conversion (LTHC) release coating film. In a further alternative embodiment, the debond layer 104 includes a dielectric material layer made of an ultra-violet (UV) glue, which loses its adhesive property when exposed to UV lights. In certain embodiments, the debond layer 104 is dispensed as a liquid and cured, or is a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

In an alternative embodiment, a buffer layer (not shown) is coated on the debond layer 104, where the debond layer 104 is sandwiched between the buffer layer and the carrier 102, and the top surface of the buffer layer may further provide a high degree of coplanarity. In some embodiments, the buffer layer is a dielectric material layer. In some embodiments, the buffer layer is a polymer layer which is made of polyimide, PBO, BCB, or any other suitable polymer-based dielectric material. In some embodiments, the buffer layer is an Ajinomoto Buildup Film (ABF), Solder Resist film (SR), or the like. In other words, the buffer layer is optional and may be omitted based on the demand, and the disclosure is not limited thereto.

Referring to FIG. 1B, in a next step, a plurality of semiconductor dies 106 may be disposed on the carrier 102 over the debond layer 104. In some embodiments, the plurality of semiconductor dies 10 is picked and placed on the debond layer 104. In certain embodiments, the semiconductor dies 106 has an active surface 106-AS, and a backside surface 106-BS opposite to the active surface 106-AS. For example, the backside surface 106-BS of the semiconductor dies 106 may be attached to the buffer layer 104 through a die attach film (not shown). By using the die attach film, a better adhesion between the semiconductor dies 106 and the debond layer 104 is ensured. In the exemplary embodiment, only three semiconductor dies 106 are illustrated. However, the disclosure is not limited thereto, and the number of semiconductor dies 106 located on the debond layer 104 may be adjusted based on product requirement.

In the exemplary embodiment, each of the semiconductor dies 106 includes a semiconductor substrate 106A, a plurality of conductive pads 106B, a passivation layer 106C, a plurality of conductive posts 106D, and a protection layer 106E. As illustrated in FIG. 1B, the plurality of conductive pads 106B is disposed on the semiconductor substrate 106A. The passivation layer 106C is formed over the semiconductor substrate 106A and has openings that partially expose the conductive pads 106B on the semiconductor substrate 106A. The semiconductor substrate 106A may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 106B may be aluminum pads, copper pads or other suitable metal pads. The passivation layer 106C may be a silicon oxide layer, a silicon nitride layer, a silicon oxynitride layer or a dielectric layer formed of any suitable dielectric materials. Furthermore, in some embodiments, a post-passivation layer (not shown) is optionally formed over the passivation layer 106C. The post-passivation layer covers the passivation layer 106C and has a plurality of contact openings. The conductive pads 106B are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 106D are formed on the conductive pads 106B by plating. In some embodiments, the protection layer 106E is formed on the passivation layer 106C or on the post passivation layer, and covering the conductive posts 106D to protect the conductive posts 106D.

In some embodiments, the semiconductor dies 106 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Referring to FIG. 1C, in a next step, an insulating material 108 is formed on the debond layer 104 and over the semiconductor dies 106. In some embodiments, the insulating material 108 is formed through, for example, a compression molding process, filling up the gaps between the semiconductor dies 106 to encapsulate the semiconductor dies 106. At this stage, the conductive posts 106D and the protection layer 106E are encapsulated by and well protected by the insulating material 108. In other words, conductive posts 106D and the protection layer 106E are not revealed and are well protected by the insulating material 108.

In some embodiments, the insulating material 108 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 108 may include an acceptable insulating encapsulation material. In some embodiments, the insulating material 108 may further include inorganic filler or inorganic compound (e.g. silica, clay, and so on) which can be added therein to optimize coefficient of thermal expansion (CTE) of the insulating material 108. The disclosure is not limited thereto.

Figure 1D:
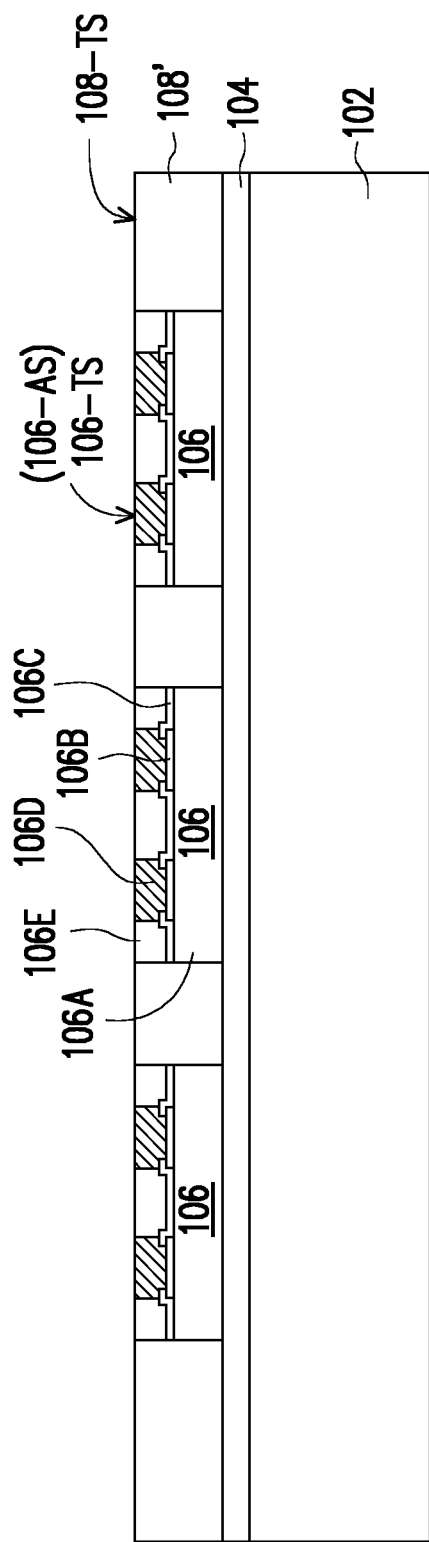

Referring to FIG. 1D, in a next step, the insulating material 108 is partially removed to expose the conductive posts 106D. In some embodiments, the insulating material 108 and the protection layer 106E are ground or polished by a planarization step. For example, the planarization step is performed through a mechanical grinding process and/or a chemical mechanical polishing (CMP) process until the top surfaces 106-TS of the conductive posts 106D are revealed. In the illustrated embodiment, the insulating material 108 is polished to form an insulating encapsulant 108'. In some embodiments, the top surface 108-TS of the insulating encapsulant 108' and the top surfaces 106-TS of the conductive posts 106D (or active surface 106-AS of the semiconductor die 106) are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1E:
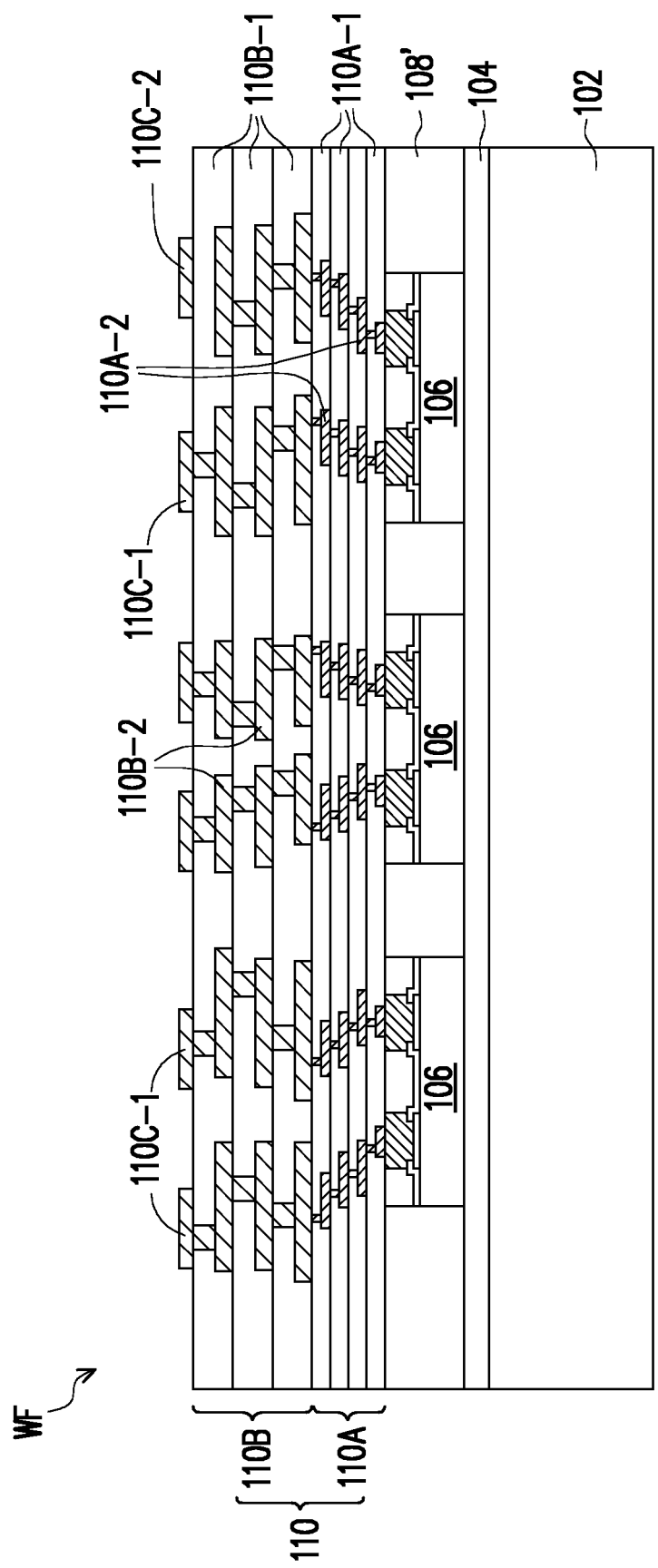

Referring to FIG. 1E, after the planarization step, a redistribution structure 110 is formed on the insulating encapsulant 110' and over the semiconductor dies 106. For example, the redistribution structure 110 is formed on the top surface 108-TS of the insulating encapsulant 108' and is electrically connected to the semiconductor dies 106. In some embodiments, the formation of the redistribution structure 110 includes the formation of a first redistribution layer 110A and a second redistribution layer 110B. The first redistribution layer 110A is formed on the insulating encapsulant 108' and located in between the insulating encapsulant 108' and the second redistribution layer 110B. The second redistribution layer 110B is formed on a top surface of the first redistribution layer 110A, and is electrically connected to the first redistribution layer 110A. In some embodiments, the first redistribution layer 110A is a fine pitch redistribution layer having smaller line width as compared with the second redistribution layer 110B.

In some embodiments, the formation of the first redistribution layer 110A includes sequentially forming one or more first dielectric layers 110A-1, and one or more first conductive layers 110A-2 in alternation. In certain embodiments, the first conductive layers 110A-2 are sandwiched between the first dielectric layers 110A-1. Although only four layers of the first conductive layers 110A-2 and four layers of the first dielectric layers 110A-1 are illustrated herein, however, the scope of the disclose is not limited by the embodiments of the disclosure. In other embodiments, the number of first conductive layers 110A-2 and the first dielectric layers 110A-1 may be adjusted based on product requirement. In some embodiments, the first conductive layers 110A-2 are electrically connected to the conductive posts 106D of the semiconductor dies 106.

Similarly, the formation of the second redistribution layer 110B includes sequentially forming one or more second dielectric layers 110B-1, and one or more second conductive layers 110B-2 in alternation. In certain embodiments, the second conductive layers 110B-2 are sandwiched between the second dielectric layers 110B-1. Although only three layers of the second conductive layers 110B-2 and three layers of the second dielectric layers 110B-1 are illustrated herein, however, the scope of the disclose is not limited by the embodiments of the disclosure. In other embodiments, the number of second conductive layers 110B-2 and the second dielectric layers 110B-1 may be adjusted based on product requirement. In some embodiments, the second conductive layers 110B-2 are electrically connected to the first conductive layers 110A-2 of the first redistribution layer 110B.

In some embodiments, the materials of the first dielectric layers 110A-1 and the second dielectric layers 110B-1 are polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. The materials of the first dielectric layers 110A-1 and the second dielectric layers 110B-1 may be the same or different. In some embodiments, the material of the first dielectric layers 110A-1 and the second dielectric layers 110B-1 are formed by suitable fabrication techniques such as spin-on coating, chemical vapor deposition (CVD), plasma-enhanced chemical vapor deposition (PECVD) or the like. The disclosure is not limited thereto.

In some embodiments, the materials of the first conductive layers 110A-2 and the second conductive layers 110B-2 are made of conductive materials formed by electroplating or deposition, such as aluminum, titanium, copper, nickel, tungsten, and/or alloys thereof, which may be patterned using a photolithography and etching process. In some embodiments, the first conductive layers 110A-2 and the second conductive layers 110B-2 are patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Referring to FIG. 1E, after forming the first redistribution layer 110A and the second redistribution layer 110B, a plurality of conductive pads 110C-1 and a plurality of dummy pads 110C-2 (only one illustrated) are formed over the second redistribution layer 110B as part of the redistribution structure 110. For example, the conductive pads 110C-1 are electrically connected to the second conductive layers 110B-2 of the second redistribution layer 110B, while the dummy pads 110C-2 are electrically isolated from the second redistribution layer 110B. In other words, the dummy pads 110C-2 have no electrical function. In some embodiments, the conductive pads 110C-1 and the dummy pads 110C-2 are formed of the same materials, and formed together in a single step. In some alternative embodiments, the conductive pads 110C-1 and the dummy pads 110C-2 are formed in different steps. Furthermore, in some embodiments, a pitch between each of the conductive pads 110C-1 is greater than a pitch between each of the dummy pads 110C-2. In the exemplary embodiment, the semiconductor dies 106, the insulating encapsulant 108' and the redistribution structure 110 are parts of a semiconductor wafer WF. For example, the dummy pads 110C-2 are located at a periphery of the semiconductor wafer.

Figure 1F:
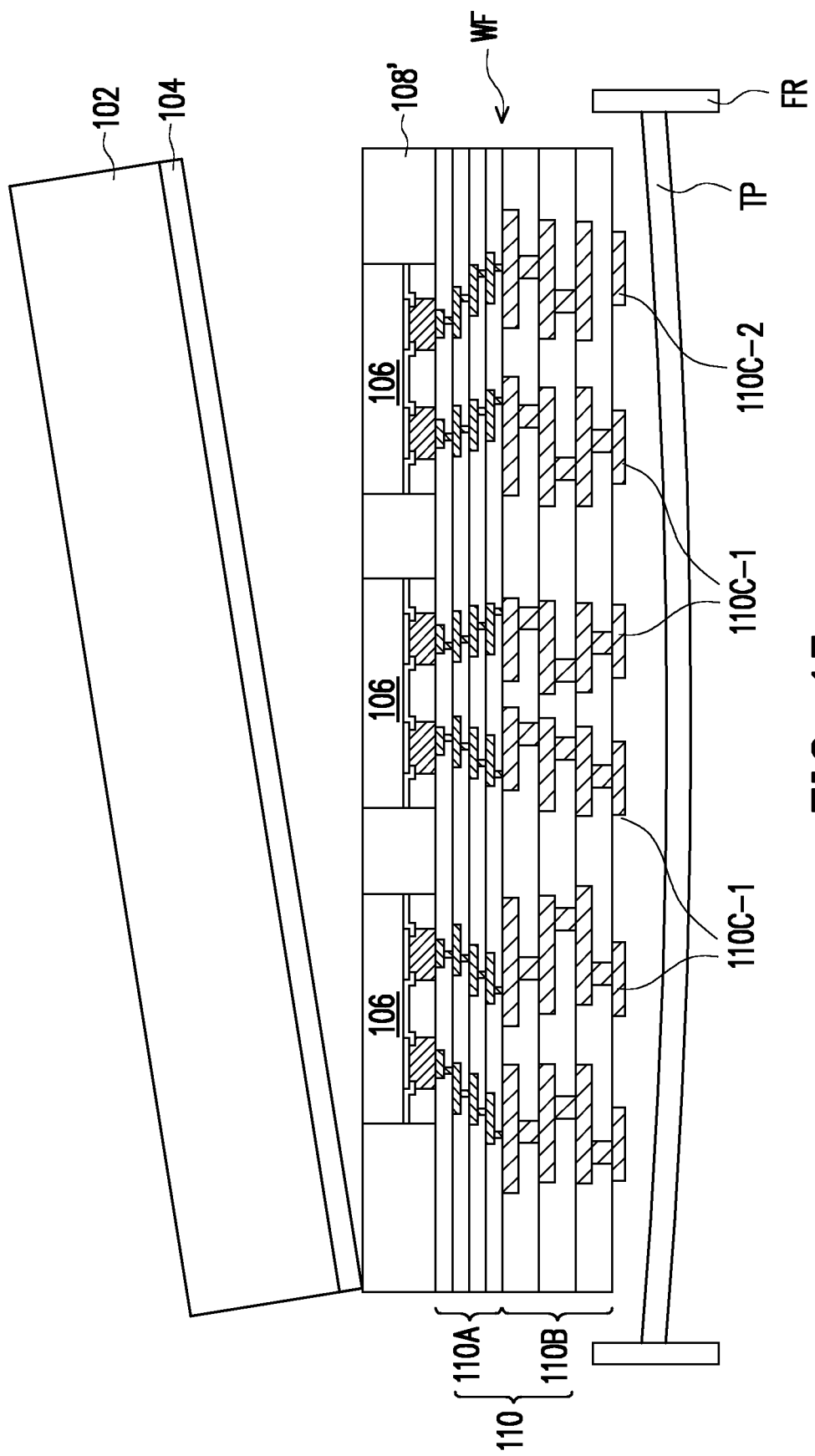

Referring to FIG. 1F, in some embodiments, after forming the redistribution structure 110, the structure shown in FIG. 1E is turned upside down and attached to a tape TP supported by a frame FR. As illustrated in FIG. 1F, the carrier 102 is debonded and is separated from the insulating encapsulant 108'. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape TP is used to secure the semiconductor wafer WF before de-bonding the carrier 102 and the debond layer 104.

Figure 1G:
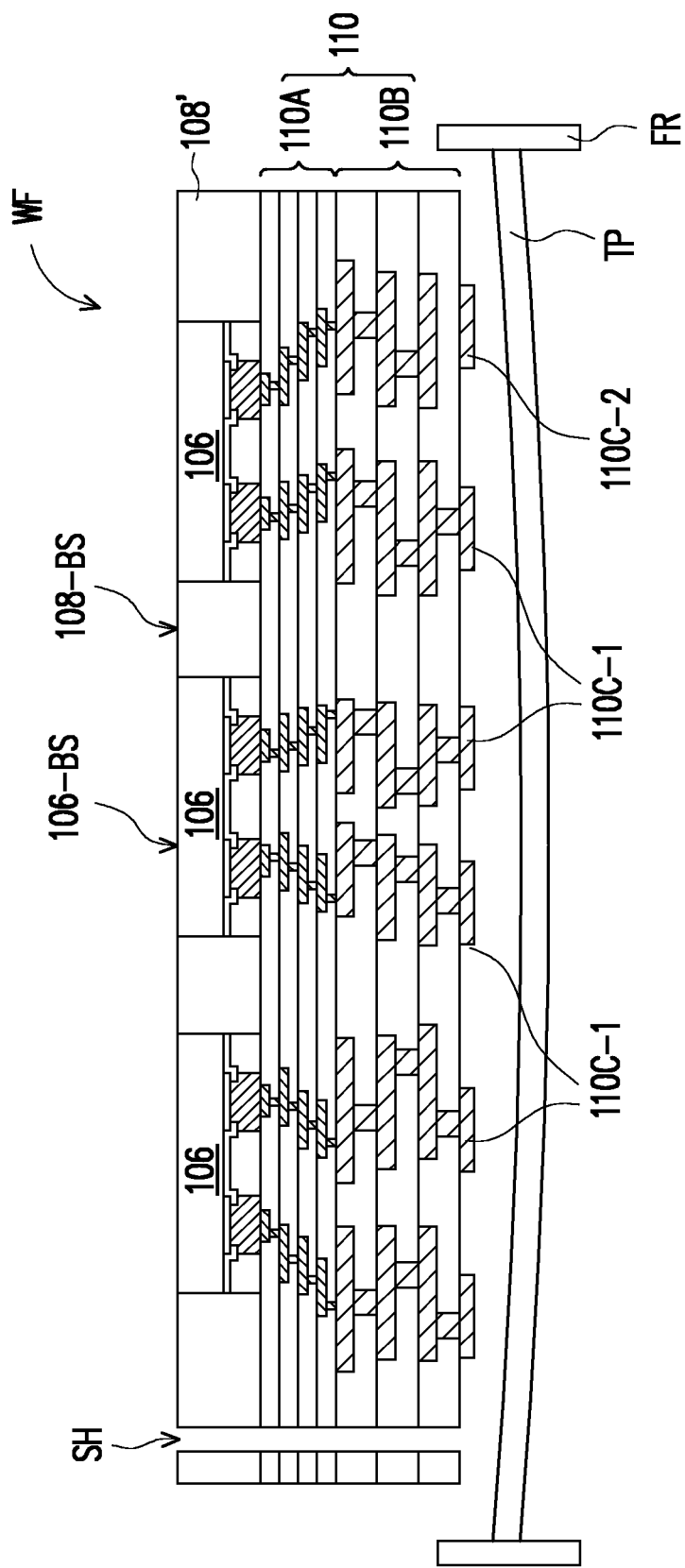

Referring to FIG. 1G, after the de-bonding process, a backside surface 108-BS of the insulating encapsulant 108' is revealed or exposed. In certain embodiments, a backside surface 106-BS of the semiconductor die 106 is exposed as well. Thereafter, a plurality of screw holes SH (only one illustrated) may be formed in the semiconductor wafer WF. In some embodiments, the plurality of screw holes SH penetrates through the semiconductor wafer WF. For example, the screw holes SH penetrates through the redistribution structure 110 and the insulating encapsulant 108'. In some embodiments, the screw holes SH are used for fixing various devices and components on the semiconductor wafer WF through a plurality of bolts (not shown). For example, the screw holes SH are used for fixing heat dissipation components such as heat sink, cold plate, cool plate, or the like on the semiconductor wafer WF. The number of screw holes SH formed in the semiconductor wafer WF may be adjusted based on product requirement.

Figure 1H:
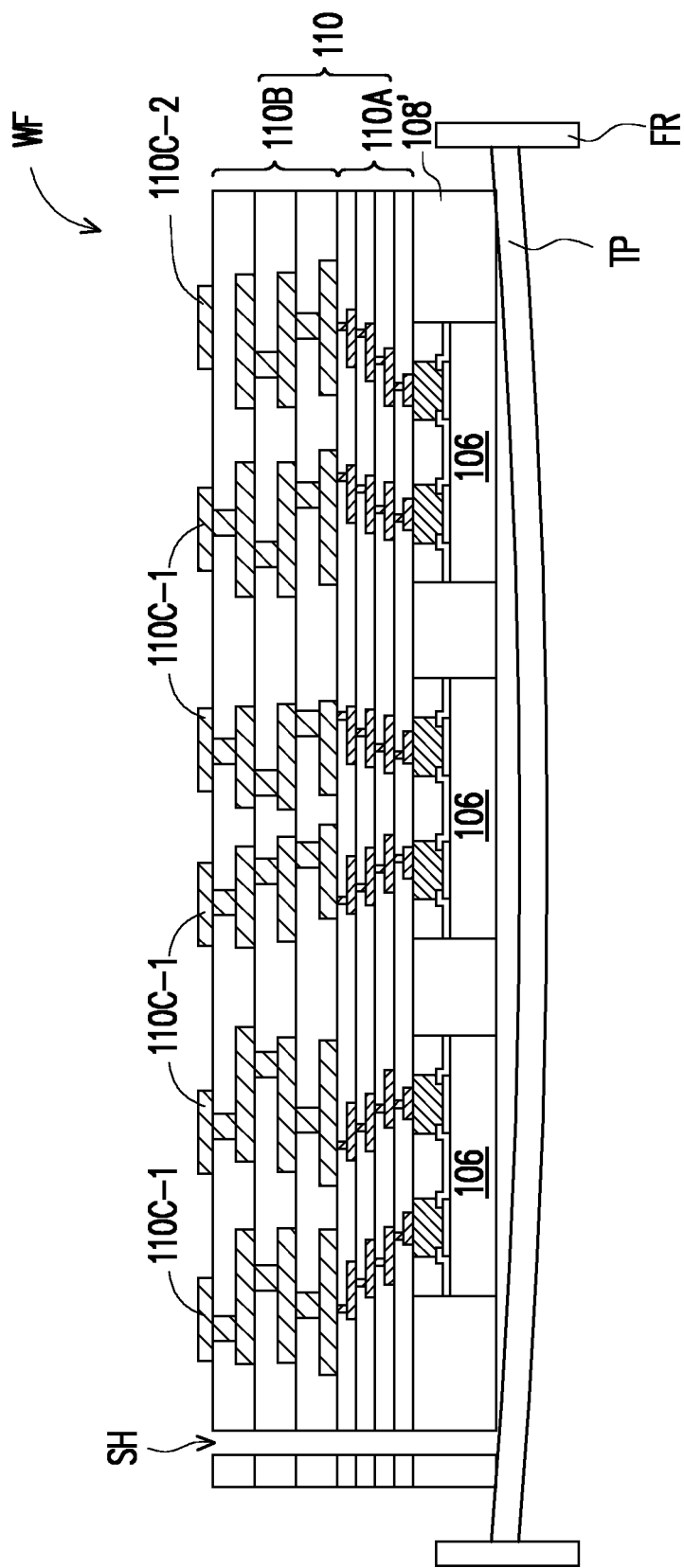

Referring to FIG. 1H, in a next step, the semiconductor wafer WF illustrated in FIG. 1G is turned upside down and re-mounted on the tape TP so that the conductive pads 110C-1 and the dummy pads 110C-2 are revealed. Subsequently, referring to FIG. 1I, a plurality of first electrical connectors 112A are formed on the redistribution structure 110, and a plurality of first surface mount components 114A (only one is shown) is electrically and physically connected to the redistribution structure 110 through the plurality of first electrical connectors 112A. Similarly, a plurality of second electrical connectors 112B are formed on the redistribution structure 110, and a plurality of second surface mount components 114B (only one is shown) is electrically and physically connected to the redistribution structure 110 through the plurality of second electrical connectors 112B. The first surface mount components 114A and the second surface mount components 114B may be integrated passive devices, DRAM (Dynamic Random Access Memory) devices, voltage regulator modules, electrical capacitance devices, or the like. The disclosure is not limited thereto. Furthermore, in some embodiments, a first barrier structure BS1 is formed on the semiconductor wafer WF over the redistribution structure 110, whereby the plurality of second surface mount components 114B is connected to the dummy pads 110C-2 through the first barrier structure BS1. In some embodiments, a material of the first electrical connectors 112A and the second electrical connectors 112B include metallic materials such as copper, aluminum, or the like. In certain embodiments, a material of the first barrier structure BS1 is similar to the material of the first electrical connectors 112A and the second electrical connectors 112B.

Figure 1I:
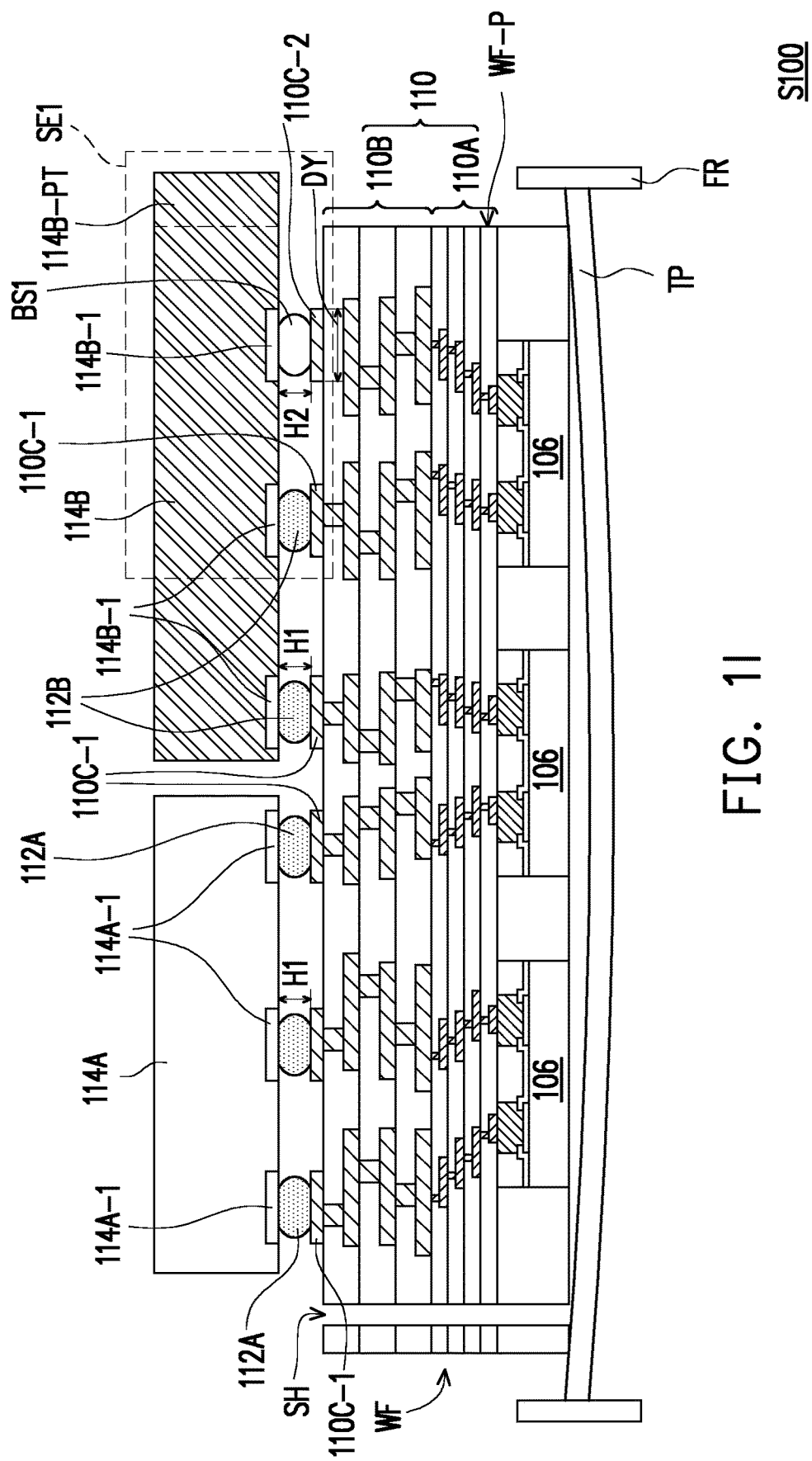

As illustrated in FIG. 1I, the first electrical connectors 112A are formed on the conductive pads 110C-1 through a reflow process, and the first surface mount components 114A are bonded to the first electrical connectors 112A through bonding pads 114A-1. Furthermore, the second electrical connectors 112B are formed on the conductive pads 110C-1 through a reflow process, and the second surface mount components 114B are bonded to the second electrical connectors 112B through bonding pads 114B-1. In a similar way, the first barrier structure BS1 is formed on the dummy pads 110C-2 through a reflow process, and the second surface mount components 114B are bonded to the first barrier structure BS1 through bonding pads 114B-1.

In some embodiments, the first surface mount components 114A are disposed on the semiconductor wafer WF, and electrically connected to the semiconductor wafer WF through the first electrical connectors 112A. The first surface mount components 114A may be disposed on the semiconductor wafer WF within a boundary of the semiconductor wafer WF, and being overlapped with the semiconductor wafer WF. In some embodiments, the second surface mount components 114B are disposed on the semiconductor wafer WF, and electrically connected to the semiconductor wafer WF through the second electrical connectors 112B. In certain embodiments, an edge of each of the second surface mount components 114B is overhanging a periphery WF-P of the semiconductor wafer WF. For example, each of the plurality of second surface mount components 114B has a protruded region 114B-PT which protrudes out from a periphery WF-P of the semiconductor wafer WF.

Figure 1J:
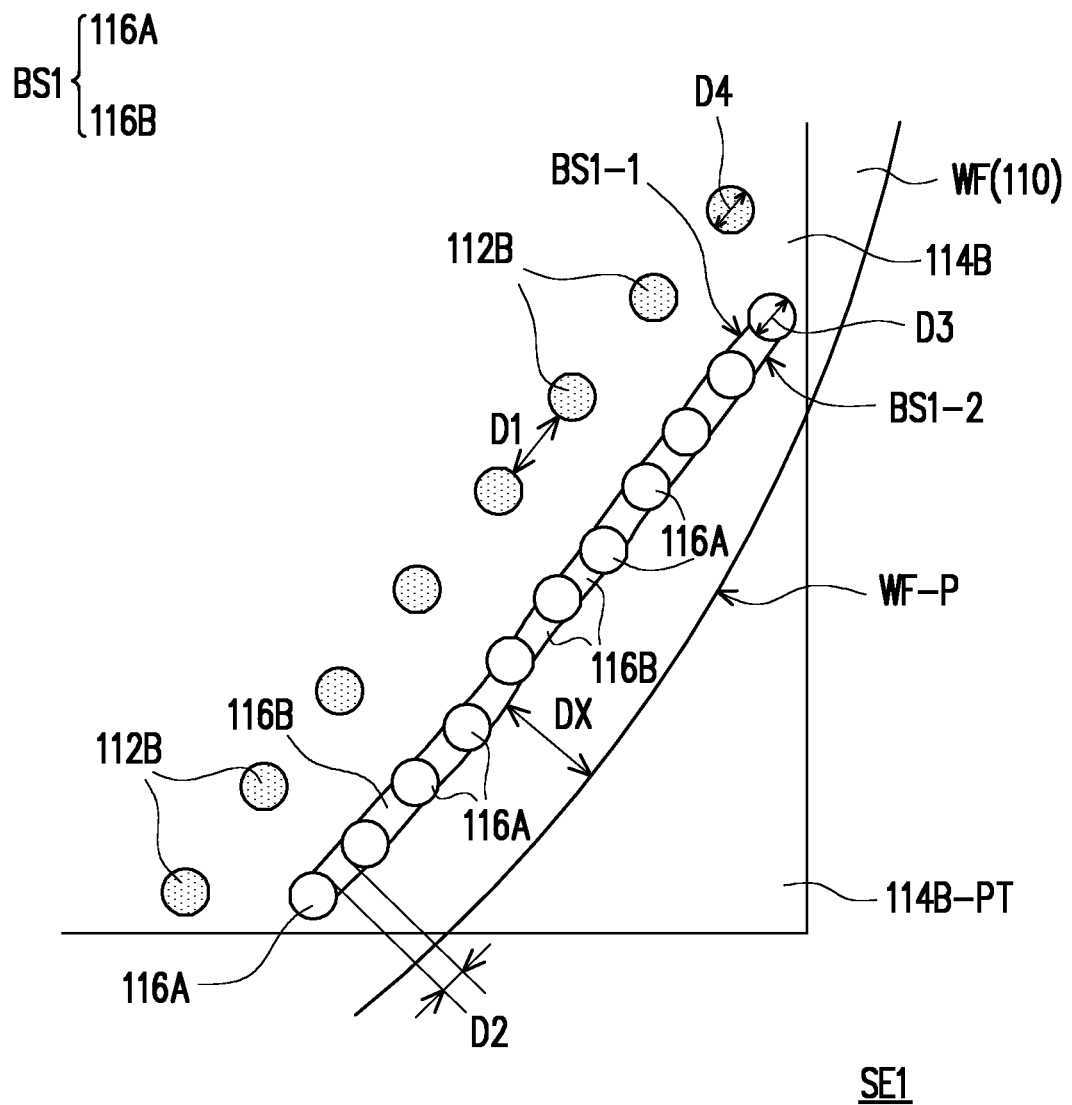

FIG. 1J is a schematic top view of a section SE1 of the structure illustrated in FIG. 1I. Referring to FIG. 1I and FIG. 1J, in some embodiments, the first barrier structure BS1 is disposed on the semiconductor wafer WF in between the second electrical connectors 112B and the edge of the second surface mount components 114B. In certain embodiments, the first barrier structure BS1 is located in between the second electrical connectors 112B and the periphery WF-P of the semiconductor wafer WF. Furthermore, the first barrier structure BS1 may be disposed in between the second surface mount components 114B and the redistribution structure 110 of the semiconductor wafer WF. In some embodiments, a first surface BS1-1 of the first barrier structure BS1 is facing the plurality of second electrical connectors 112B, and a second surface BS1-2 of the first barrier structure BS1 is facing away from the plurality of second electrical connectors 112B, or is facing the periphery WF-P of the semiconductor wafer WF. In some embodiments, a height H2 of the first barrier structure BS1 is substantially equal to a height H1 of the first electrical connectors 112A and the second electrical connectors 112B.

As further illustrated in FIG. 1J, the second electrical connectors 112B (as well as the first electrical connectors 112A that are not illustrated) are spaced apart from one another by a distance D1, wherein the distance D1 is greater than a width D4 of the second electrical connectors 112B (and first electrical connectors 112A). In one embodiment, a ratio of D1:D4 is approximately 1.5:1 to prevent the merging of the electrical connectors (112A/112B). In some embodiments, the first barrier structure BS1 comprises a wall structure having a plurality of conductive elements 116A disposed on the plurality of dummy pads 110C-2, and a plurality of connecting elements 116B joining the plurality of conductive elements 116A together. In some embodiments, the first barrier structure BS1 is spaced apart from the periphery WF-P of the semiconductor wafer WF by a distance DX. In the exemplary embodiment, the width DY of the dummy pads 110C-2 (shown in FIG. 1I) is greater than a distance D2 between the plurality of conductive elements 116A of the first barrier structure BS1. Similarly, a width D3 of the conductive elements 116A is greater than the distance D2 between the plurality of conductive elements 116A. In certain embodiments, a ratio of D3:D2 is approximately 1:0.5 and a ratio DY:D2 is approximately 1:0.5 to enhance the merging of the conductive elements 116A.

In the exemplary embodiment, the first barrier structure BS1 is formed by forming the plurality of conductive elements 116A on the dummy pads 110C-2 of the redistribution layer 110, and performing a reflow process so that the plurality of conductive elements 116A is merged to form a plurality of connecting elements 116B joining the plurality of conductive elements 116A together. Since the dummy pads 110C-2 are arranged with a pitch corresponding to the distance D2, the merging of the conductive elements 116A located on the dummy pads 110C-2 to form the connecting elements 116B is made possible. On the contrary, the conductive pads 110C-1 are arranged with a pitch corresponding to the distance D1, thus the merging of the first and second electrical connectors 112A and 112B located thereon may be avoided.

Figure 1K:
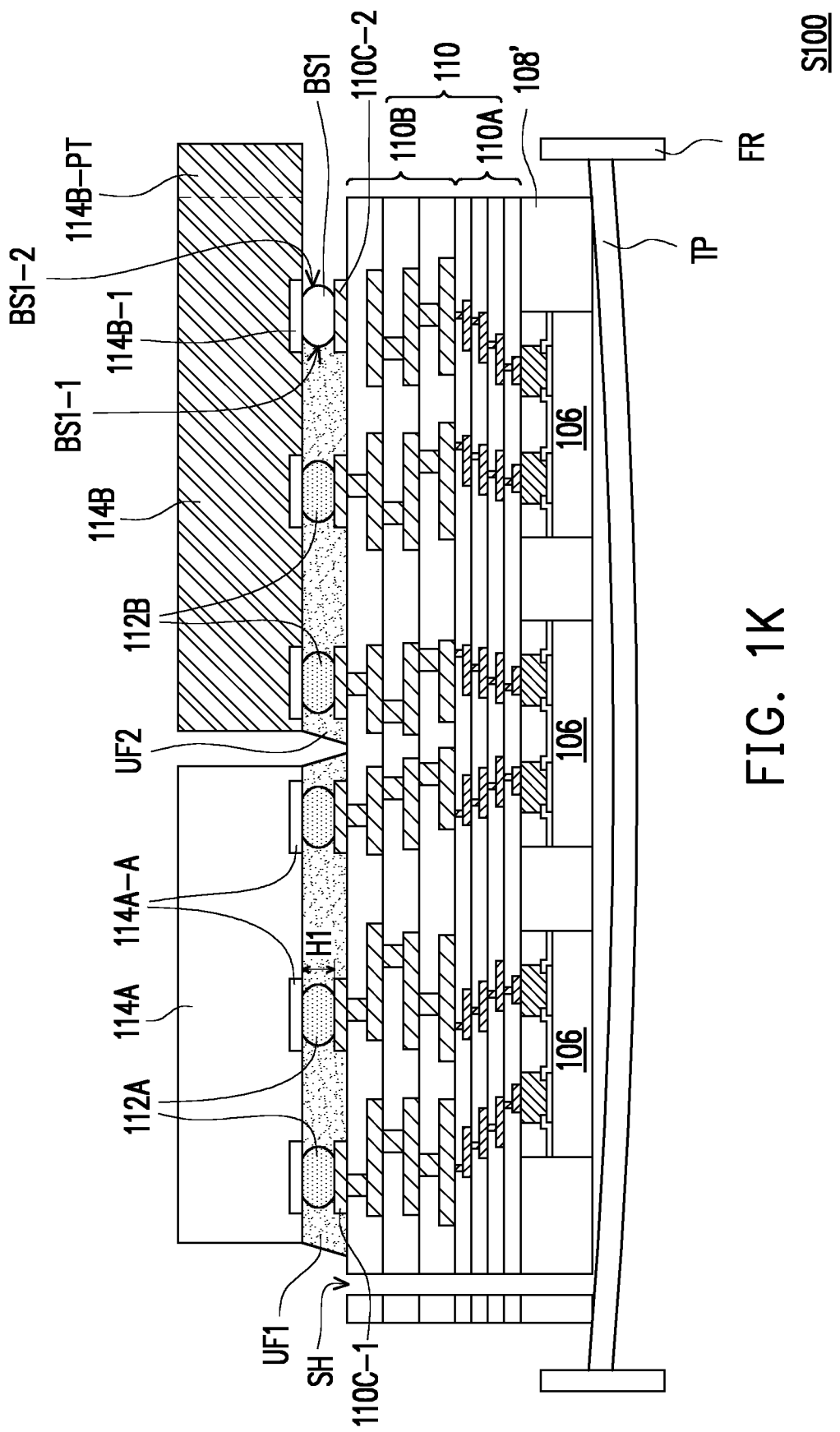

Referring to FIG. 1K, in a next step, a first underfill UF1 is formed to cover the plurality of first electrical connectors 112A, while a second underfill UF2 is formed to cover the plurality of second electrical connectors 112B. For example, the first underfill UF1 fill the spaces between the first surface mount components 114A and the redistribution structure 110 to cover the first electrical connectors 112A, while the second underfill UF2 fill the spaces between the second surface mount components 114B and the redistribution structure 110 to cover the second electrical connectors 112B. In some embodiments, the second underfill UF2 covers the first surface BS1-1 of the first barrier structure BS1, while the second surface BS1-2 of the first barrier structure BS1 is revealed. In other words, the spread of the second underfill UF2 is hindered by the first barrier structure BS1. After forming the first underfill UF1 and the second underfill UF2, a semiconductor structure S100 according to some embodiments of the present disclosure is accomplished.

Figure 1L:
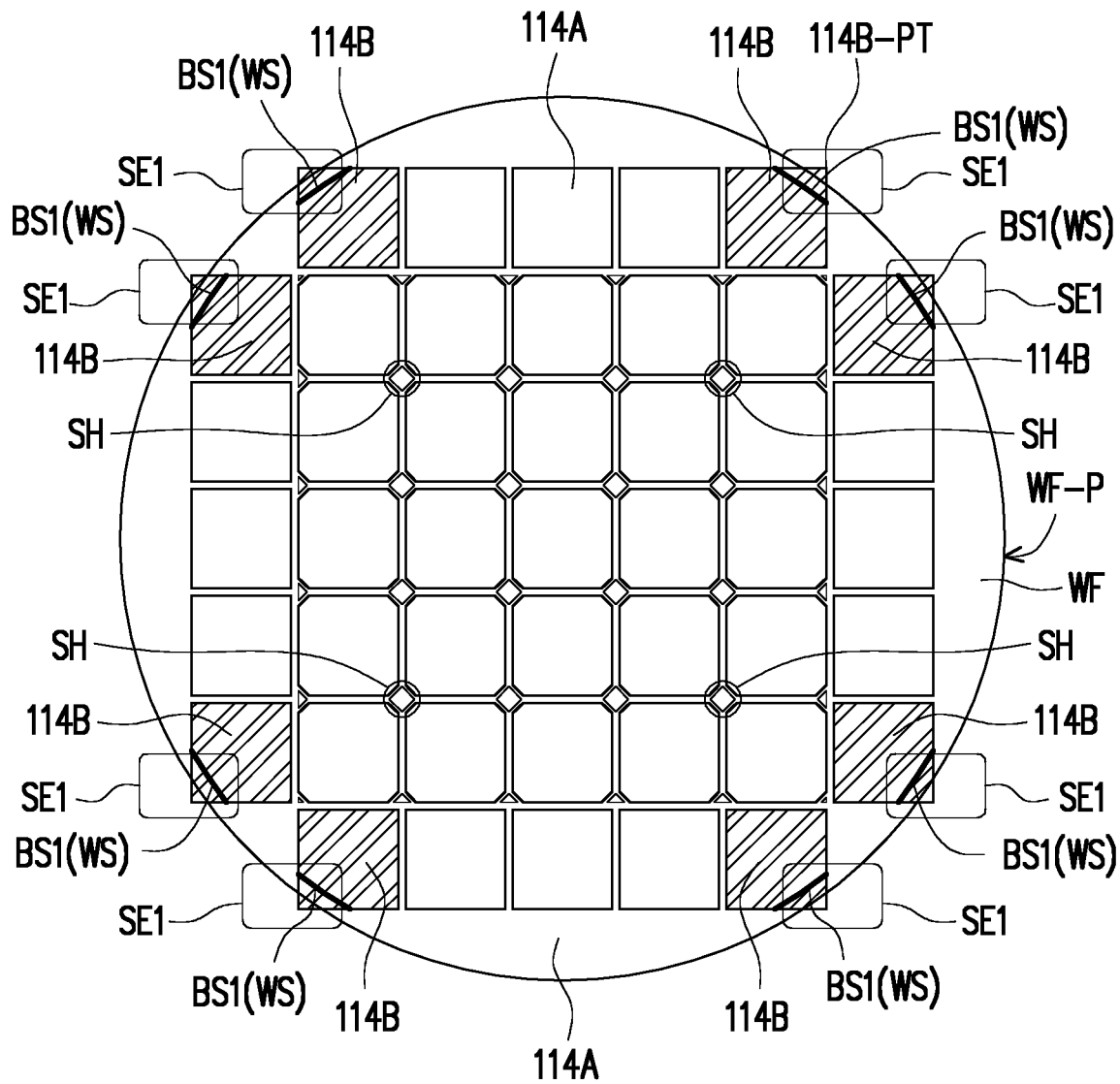

FIG. 1L is a top view of the semiconductor structure S100 illustrated in FIG. 1K according to some embodiments of the present disclosure. In the method shown in FIG. 1A to FIG. 1K, only one first surface mount component 114A and one second surface mount component 114B is shown for ease of illustration. However, it should be noted that the number of first surface mount components 114A and second surface mount components 114B should be more than one. For example, referring to FIG. 1L, in the exemplary embodiment, the semiconductor wafer WF is a circular semiconductor wafer, and a plurality of first surface mount components 114A and a plurality of second surface mount components 114B are disposed on the semiconductor wafer WF. As described previously, first surface mount components 114A are disposed on the semiconductor wafer WF within a boundary of the semiconductor wafer WF, while the second surface mount components 114B has a protruded region 114B-PT which protrudes out from a periphery WF-P of the semiconductor wafer WF.

As illustrated in FIG. 1L, the semiconductor wafer WF has a plurality of sections SE1 corresponding to that described in FIG. 1I and FIG. 1J, whereby the first barrier structure BS1 is arranged thereon. In some embodiments, the first barrier structure BS1 includes a plurality of wall structures WS that is arranged below and overlapped with one of the second surface mount components 114B, in between the second surface mount component 114B and the redistribution structure 110 of the semiconductor wafer WF. In other words, the number of second surface mount components 114B corresponds to the number of wall structures of the first barrier structure BS1. Furthermore, a length of each of the wall structures WS does not extend beyond the periphery of the second surface mount components 114B. In the exemplary embodiment, by using the first barrier structure BS1 to block the spreading of the second underfill UF2, a risk of underfill bleeding at the wafer edge is significantly reduced.

FIG. 2A to FIG. 2D are schematic sectional and top views of various stages in a method of fabricating a semiconductor structure according to some other exemplary embodiments of the present disclosure. The method illustrated in FIG. 2A to FIG. 2D is similar to the method illustrated in FIG. 1A to FIG. 1L, therefore, the same reference numerals are used to refer to the same or liked parts, and its detailed description is omitted herein. The difference between the embodiments is in the design of the first barrier structure BS1. In the previous embodiment, the first barrier structure BS1 is shown to include conductive elements 116A and connecting elements 116B, whereby the conductive elements 116A are disposed on and connected to the dummy pads 110C-2. However, in the embodiment shown in FIG. 2A to FIG. 2D, the first barrier structure BS1 comprises a polymer wall structure PW disposed on the second dielectric layer 110B-1 of the redistribution structure 110.

Figure 2A:
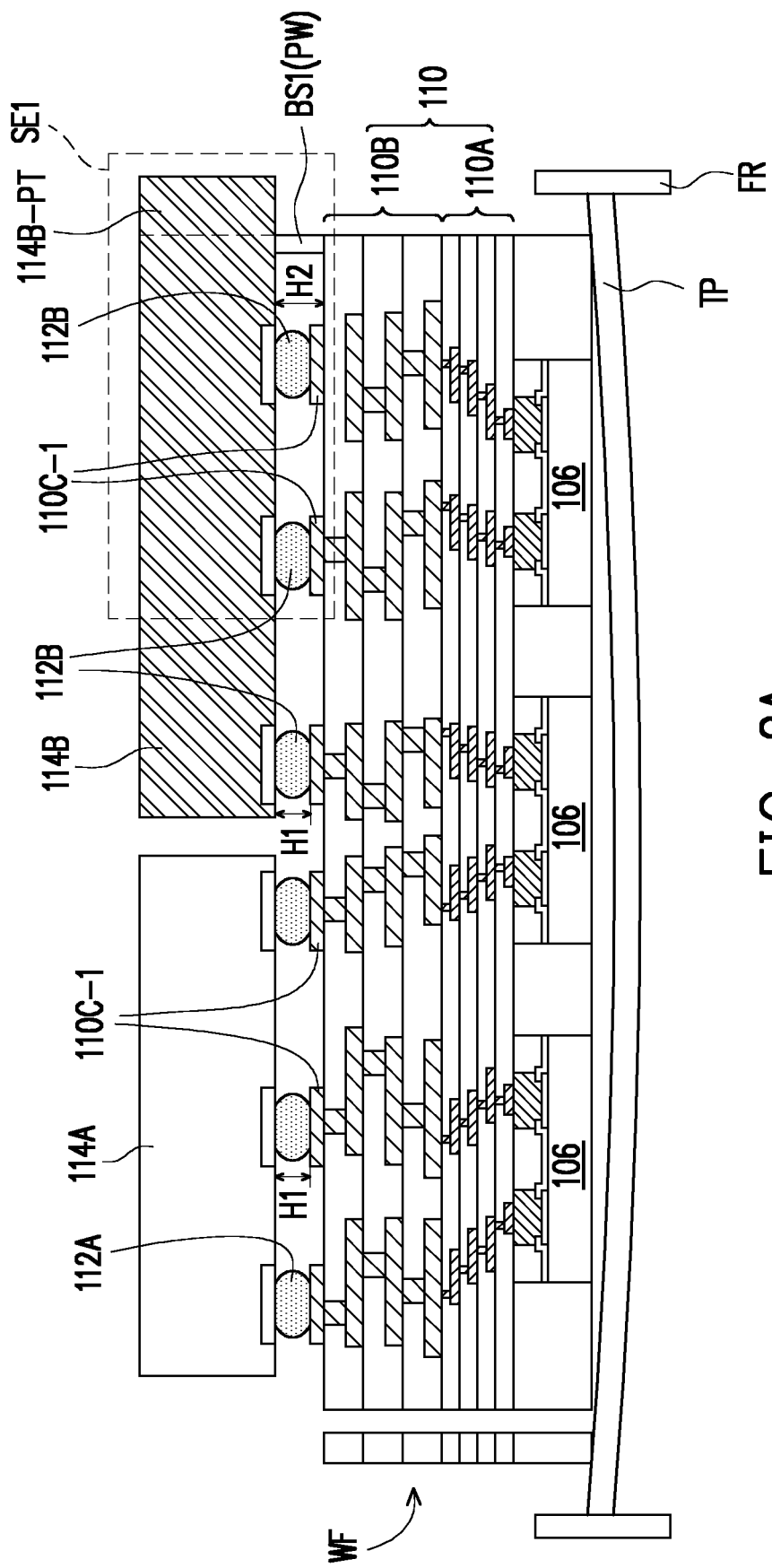
FIG. 2A to FIG. 2D are schematic sectional and top views of various stages in a method of fabricating a semiconductor structure according to some other exemplary embodiments of the present disclosure.
Figure 2B:
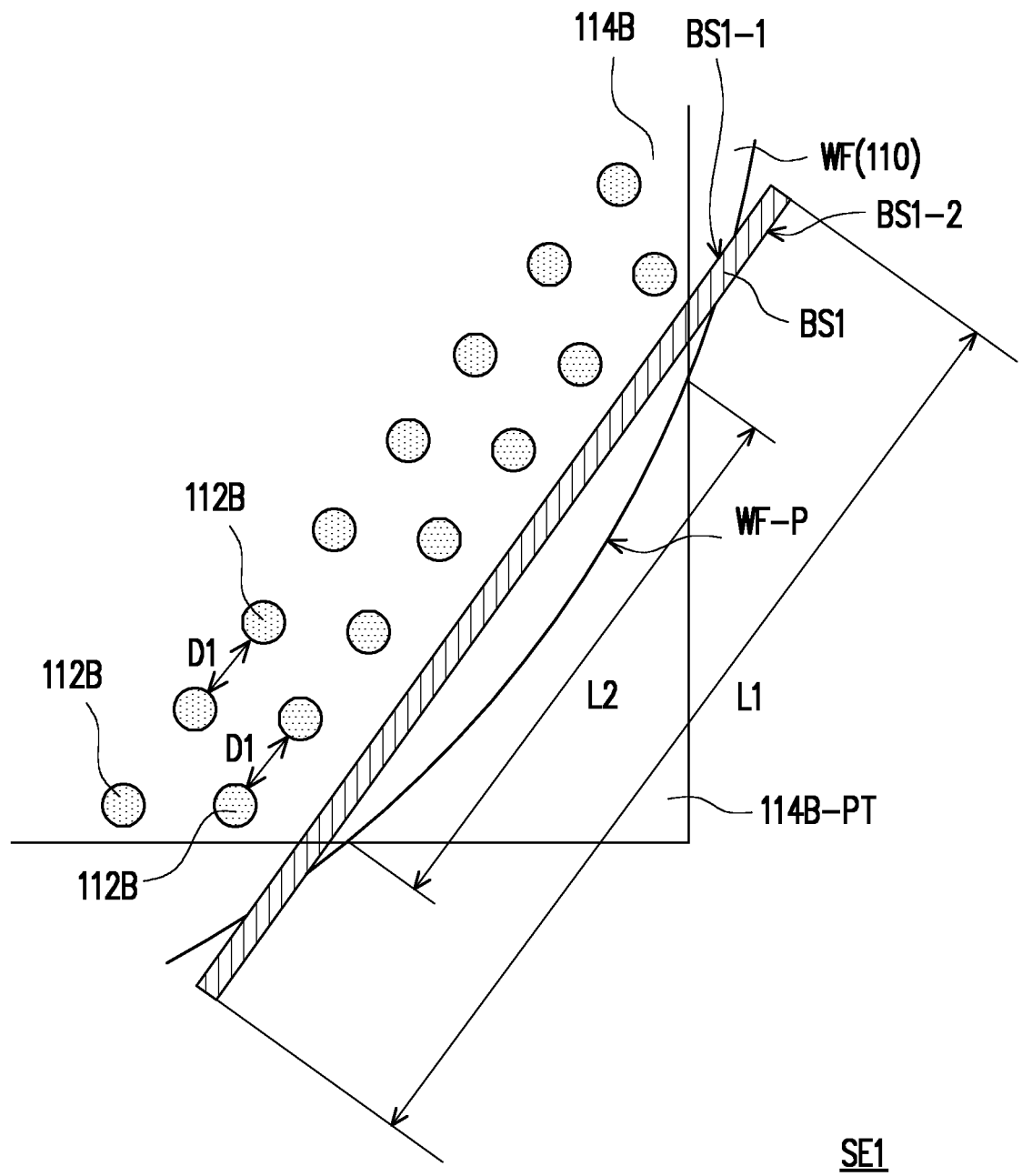

As illustrated in FIG. 2A and FIG. 2B, the first barrier structure BS1 is formed by printing or dispending a polymer material on the redistribution structure 110 and curing the polymer material to form a polymer wall structure PW. In an alternative embodiment, the polymer wall structure PW is formed on the redistribution structure 110 by lamination. In some embodiments, the polymer wall structure PW extends beyond the periphery of the second surface mount components 114B. Furthermore, the polymer wall structure PW may extend beyond the periphery WF-P of the semiconductor wafer WF. In some embodiments, the height H2 of the first barrier structure BS1 (or polymer wall structure PW) is equal to or greater than a height H1 of the first electrical connectors 112A and the second electrical connectors 112B. In addition, a length L1 of the polymer wall structure PW is greater than a perimeter length L2 of the semiconductor wafer WF that is located underneath the second surface mount components 114B.

Figure 2C:
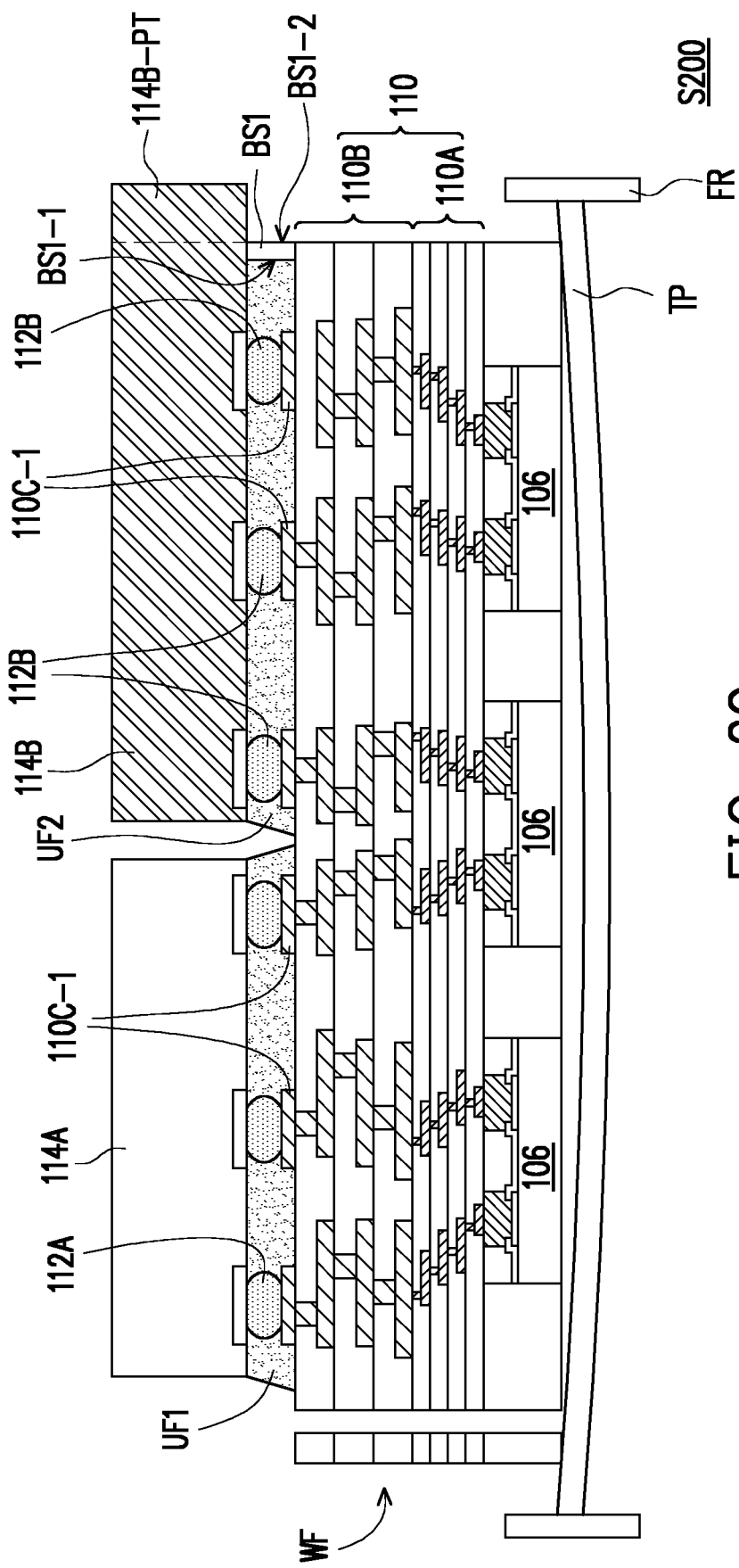

Referring to FIG. 2C, after forming the first barrier structure BS1 and disposing the first surface mount components 114A and the second surface mount components 114B on the semiconductor wafer WF, a first underfill UF1 is formed to cover the plurality of first electrical connectors 112A, while a second underfill UF2 is formed to cover the plurality of second electrical connectors 112B. In some embodiments, the first underfill UF1 fill the spaces between the first surface mount components 114A and the redistribution structure 110 to cover the first electrical connectors 112A, while the second underfill UF2 fill the spaces between the second surface mount components 114B and the redistribution structure 110 to cover the second electrical connectors 112B. In some embodiments, the second underfill UF2 covers the first surface B S1-1 of the first barrier structure B S1 (polymer wall structure PW), while the second surface BS1-2 of the first barrier structure BS1 (polymer wall structure PW) is revealed. In other words, the spread of the second underfill UF2 is hindered by the first barrier structure BS1 (polymer wall structure PW). After forming the first underfill UF1 and the second underfill UF2, a semiconductor structure S200 according to some embodiments of the present disclosure is accomplished.

Figure 2D:
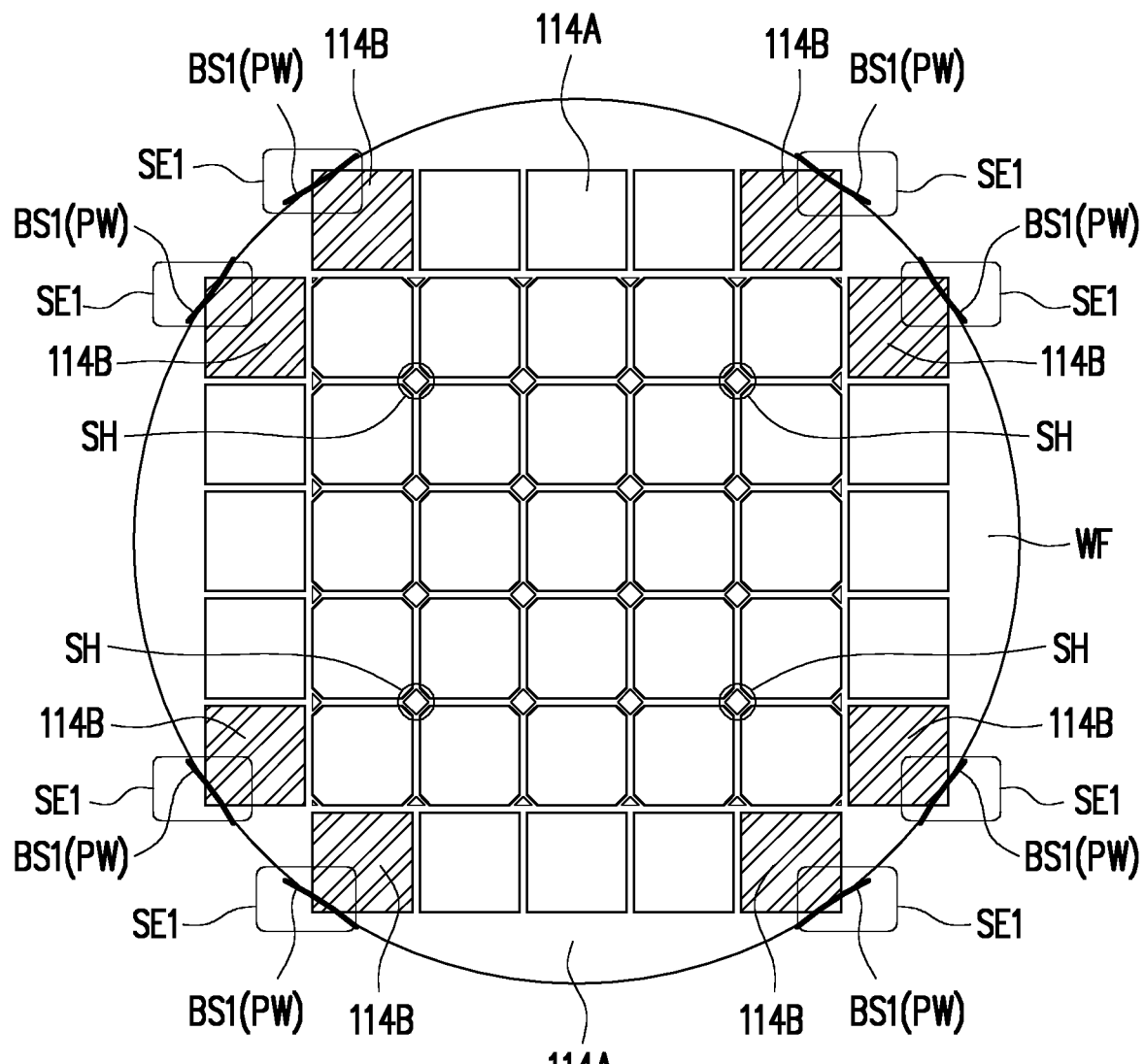

FIG. 2D is a top view of the semiconductor structure S200 illustrated in FIG. 2C according to some embodiments of the present disclosure. Referring to FIG. 2D, in the exemplary embodiment, the semiconductor wafer WF is a circular semiconductor wafer, and a plurality of first surface mount components 114A and a plurality of second surface mount components 114B are disposed on the semiconductor wafer WF. As illustrated in FIG. 2D, the semiconductor wafer WF has a plurality of sections SE1 corresponding to that described in FIG. 2A and FIG. 2B, whereby the first barrier structure BS1 is arranged thereon. In some embodiments, the first barrier structure BS1 includes a plurality of polymer wall structures PW. In some embodiments, each of the polymer wall structures PW are arranged below and overlapped with one of the second surface mount components 114B, in between the second surface mount component 114B and the redistribution structure 110 of the semiconductor wafer WF. In other words, the number of second surface mount components 114B corresponds to the number of the polymer wall structures PW. Furthermore, the length of each of the polymer wall structures PW extend beyond the periphery of the second surface mount components 114B. In the exemplary embodiment, by using the first barrier structure BS1 to block the spreading of the second underfill UF2, a risk of underfill bleeding at the wafer edge is significantly reduced.

Figure 3:
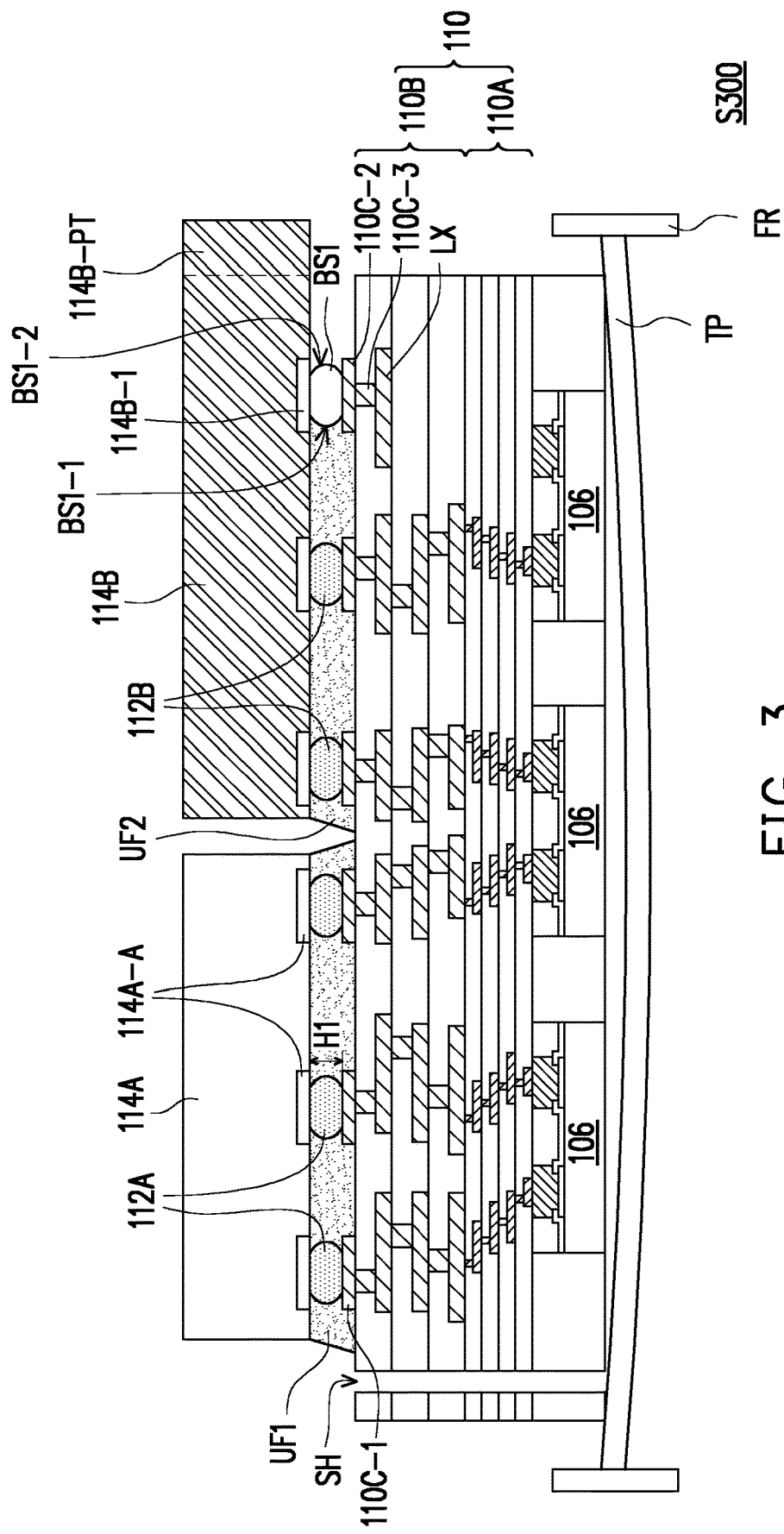
FIG. 3 is a schematic sectional view of a semiconductor structure according to some exemplary embodiments of the present disclosure.

FIG. 3 is a schematic sectional view of a semiconductor structure according to some exemplary embodiments of the present disclosure. The semiconductor structure S300 illustrated in FIG. 3 is similar to the semiconductor structure S100 illustrated in FIG. 1K, therefore, the same reference numerals are used to refer to the same or liked parts, and its detailed description is omitted herein. The difference between the embodiments is that the semiconductor structure S300 further includes a dummy via 110C-3 and a landing pad LX. As illustrated in FIG. 3, in some embodiments, the semiconductor structure 110 further includes the dummy via 110C-3 and the landing pad LX that are connected to each of the dummy pads 110C-2. However, the landing pad LX and the dummy via 110C-3 have no electrical function, and are used to support the dummy pads 110C-2. Similar to the above embodiments, the semiconductor structure S300 includes a first barrier structure BS1 used to block the spreading of the second underfill UF2. As such, a risk of underfill bleeding at the wafer edge is significantly reduced.

Figure 4:
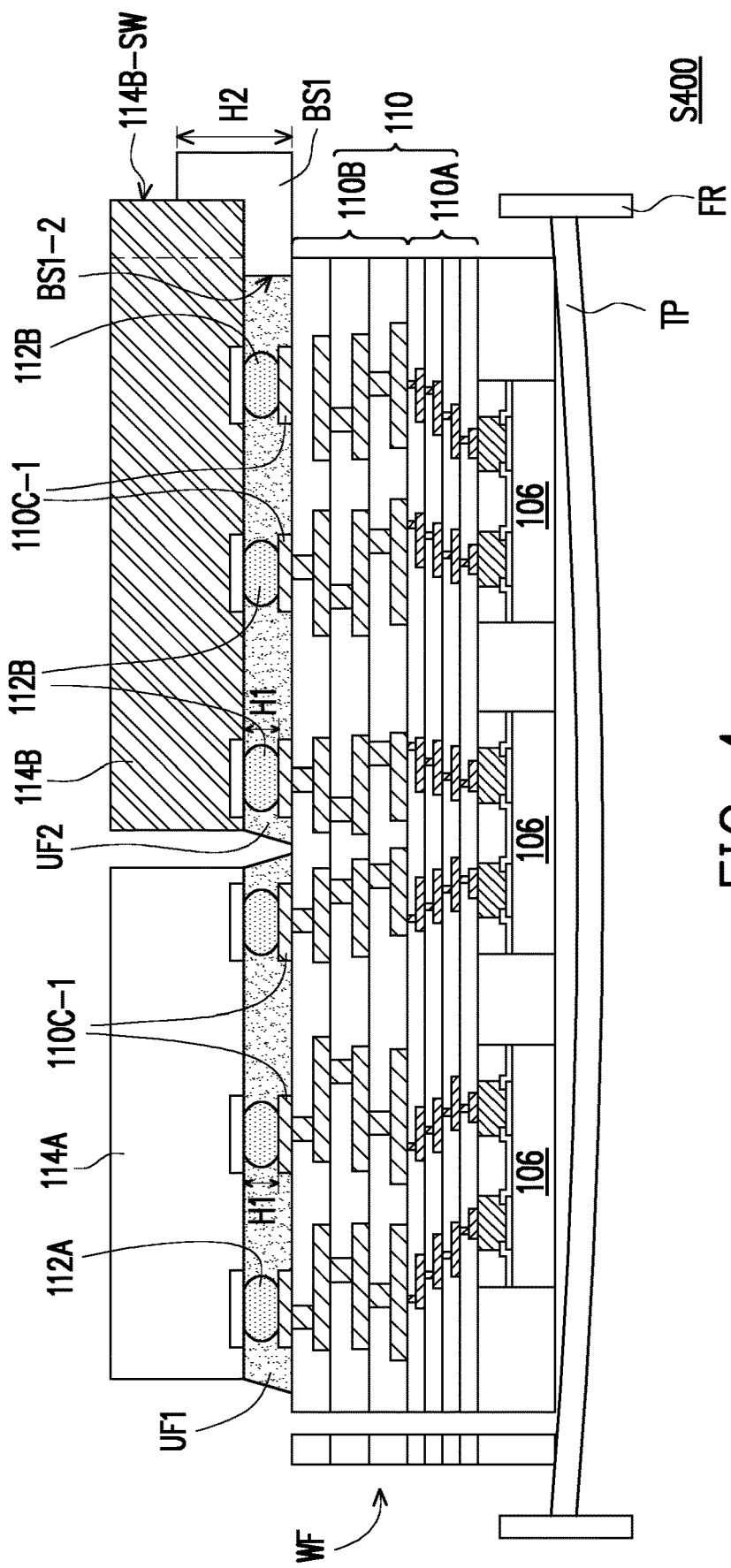
FIG. 4 is a schematic sectional view of a semiconductor structure according to some other exemplary embodiments of the present disclosure.

FIG. 4 is a schematic sectional view of a semiconductor structure according to some other exemplary embodiments of the present disclosure. The semiconductor structure S400 illustrated in FIG. 4 is similar to the semiconductor structure S200 illustrated in FIG. 2C, therefore, the same reference numerals are used to refer to the same or liked parts, and its detailed description is omitted herein. The difference between the embodiments is in the design of the first barrier structure BS1. In the semiconductor structure S200 shown in FIG. 2C, the first barrier structure BS1 is located in between the second surface mount components 114B and the redistribution structure 110. However, the disclosure is not limited thereto. As illustrated in the semiconductor structure S400 of FIG. 4, the first barrier structure BS1 is located in between the second surface mount components 114B and the redistribution structure 110, and are further extending along a sidewall 114B-SW of the second surface mount components 114B. In some embodiments, the first barrier structure BS1 partially covers the sidewall 114B-SW of the second surface mount components 114B. In some embodiments, when the second surface mount components 114B are mounted on the second electrical connectors 112B and pressed on the first barrier structure BS1, the first barrier structure BS1 including polymer wall structures may be folded or bended so that it leans against the sidewall 114B-SW of the second surface mount components 114B. In certain embodiments, a height H2 (maximum height) of the first barrier structure BS1 is greater than a height H1 of the first electrical connectors 114A and the second electrical connectors 114B. Similar to the above embodiments, the semiconductor structure S400 includes a first barrier structure BS1 used to block the spreading of the second underfill UF2. As such, a risk of underfill bleeding at the wafer edge is significantly reduced.

Figure 5:
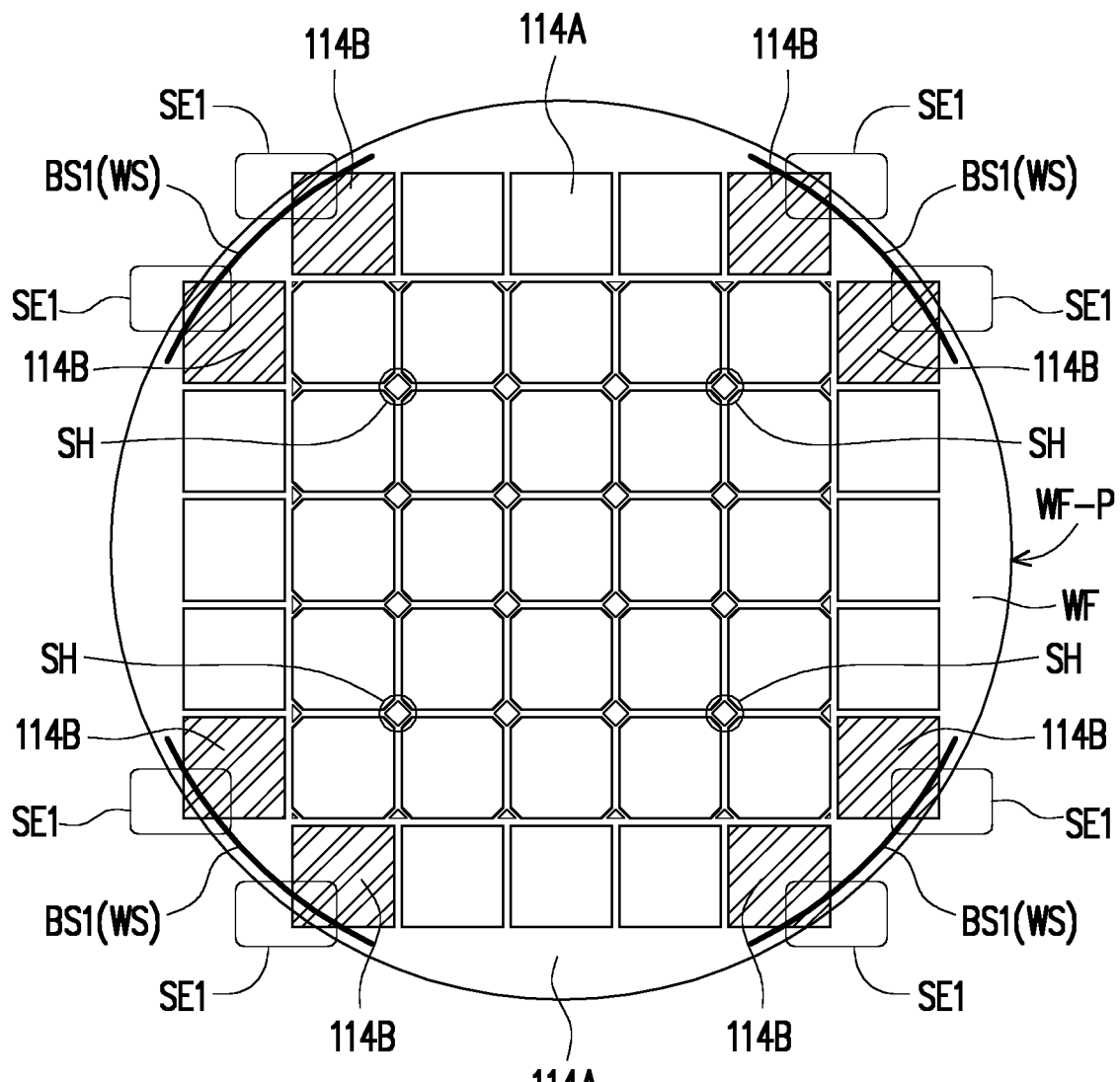
FIG. 5 is a schematic top view of a semiconductor structure according to some other exemplary embodiments of the present disclosure.

FIG. 5 is a schematic top view of a semiconductor structure according to some other exemplary embodiments of the present disclosure. The semiconductor structure S500 illustrated in FIG. 5 is similar to the semiconductor structure S100 illustrated in FIG. 1L, therefore, the same reference numerals are used to refer to the same or liked parts, and its detailed description is omitted herein. In the previous embodiments, each of the wall structures WS (or polymer wall structures PW) of the first barrier structure B S1 are arranged below and overlapped with one of the second surface mount components 114B. However, the disclosure is not limited thereto. Referring to FIG. 5, the semiconductor wafer WF is a circular semiconductor wafer, and the first barrier structure BS1 comprises a plurality of wall structures WS (or polymer wall structures PW) arranged in a circular fashion. In some embodiments, one of the wall structures WS (or polymer wall structures PW) is overlapped with at least two of the second surface mount components 114B. Similar to the above embodiments, the semiconductor structure S500 includes a first barrier structure BS1 used to block the spreading of the second underfill UF2. As such, a risk of underfill bleeding at the wafer edge is significantly reduced.

Figure 6:
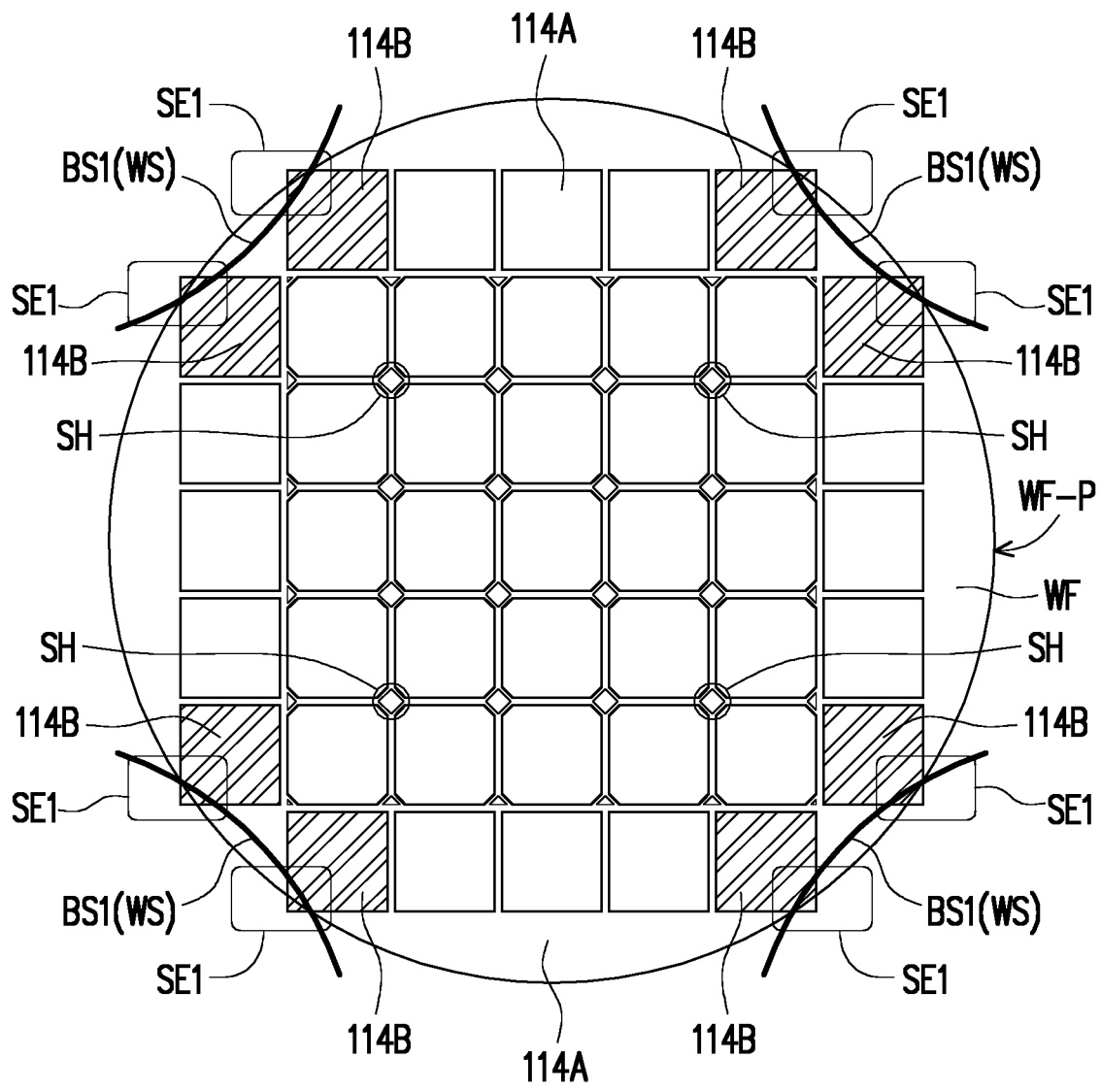
FIG. 6 is a schematic top view of a semiconductor structure according to some other exemplary embodiments of the present disclosure.

FIG. 6 is a schematic top view of a semiconductor structure according to some other exemplary embodiments of the present disclosure. The semiconductor structure S600 illustrated in FIG. 6 is similar to the semiconductor structure S500 illustrated in FIG. 5, therefore, the same reference numerals are used to refer to the same or liked parts, and its detailed description is omitted herein. The difference between the embodiments is in the design of the first barrier structure BS1. In the semiconductor structure S500 illustrated in FIG. 5, the first barrier structure BS1 includes a plurality of wall structures WS (or polymer wall structures PW) that is bent inwards (or concave shaped) and arranged in a circular fashion. However, the disclosure is not limited thereto. Referring to FIG. 6, the first barrier structure BS1 includes a plurality of wall structures WS (or polymer wall structures PW) that is bent outwards (or convex shaped), whereby each of the wall structures WS extend beyond the periphery WF-P of the semiconductor wafer WF. Similar to the above embodiments, the semiconductor structure S600 includes a first barrier structure BS1 used to block the spreading of the second underfill UF2. As such, a risk of underfill bleeding at the wafer edge is significantly reduced.

Figure 7:
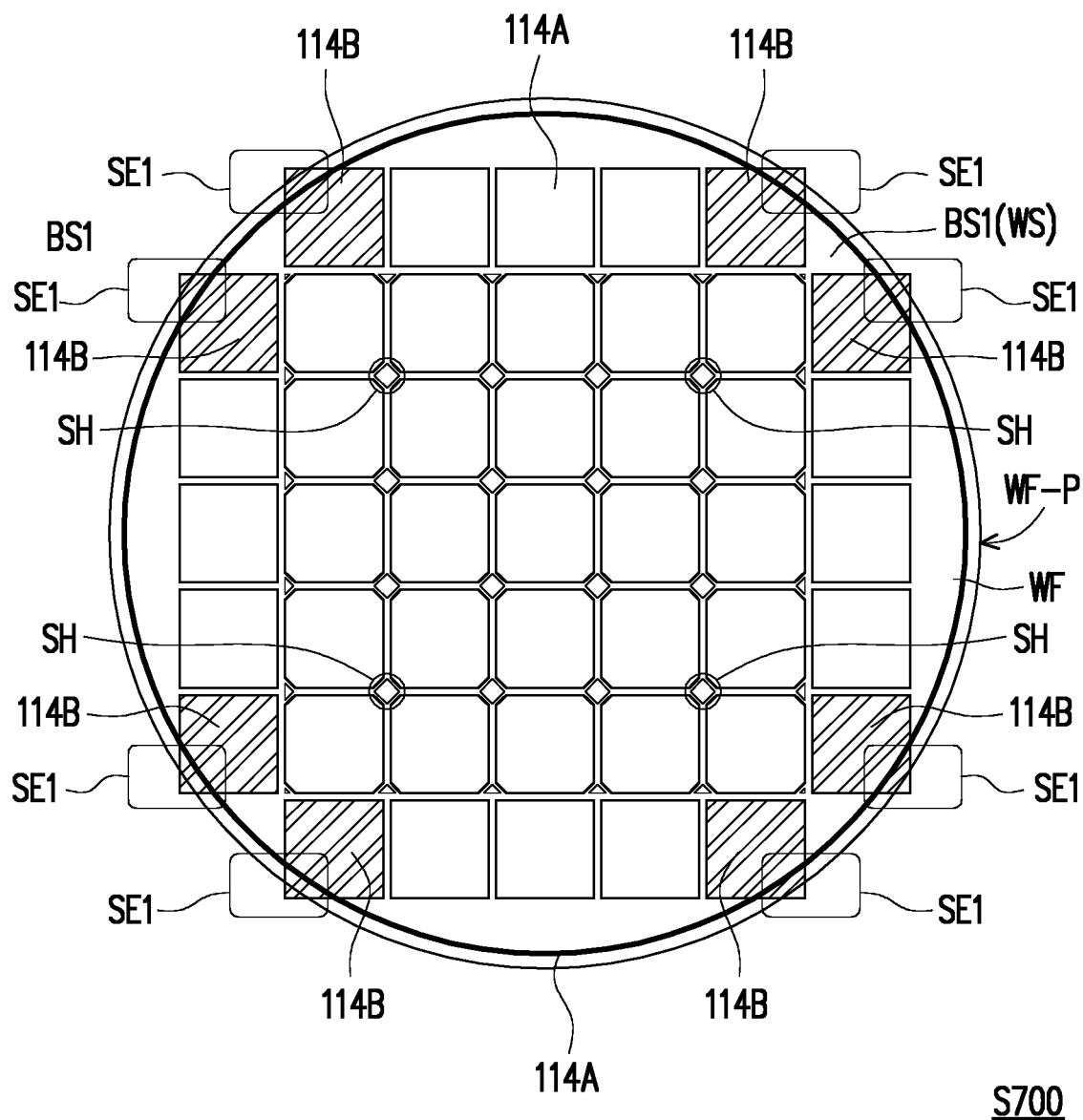
FIG. 7 is a schematic top view of a semiconductor structure according to some other exemplary embodiments of the present disclosure.

FIG. 7 is a schematic top view of a semiconductor structure according to some other exemplary embodiments of the present disclosure. The semiconductor structure S700 illustrated in FIG. 7 is similar to the semiconductor structure S100 illustrated in FIG. 1L, therefore, the same reference numerals are used to refer to the same or liked parts, and its detailed description is omitted herein. In the previous embodiments, each of the wall structures WS (or polymer wall structures PW) of the first barrier structure B S1 are arranged below and overlapped with one of the second surface mount components 114B. However, the disclosure is not limited thereto. Referring to FIG. 7, the first barrier structure BS1 includes one wall structure WS (or polymer wall structure PW) that is overlapped with all the plurality of second surface mount components 114B. Furthermore, the single wall structure WS is surrounding all the first surface mount components 114A. Similar to the above embodiments, the semiconductor structure S700 includes a first barrier structure BS1 used to block the spreading of the second underfill UF2. As such, a risk of underfill bleeding at the wafer edge is significantly reduced.

Figure 8:
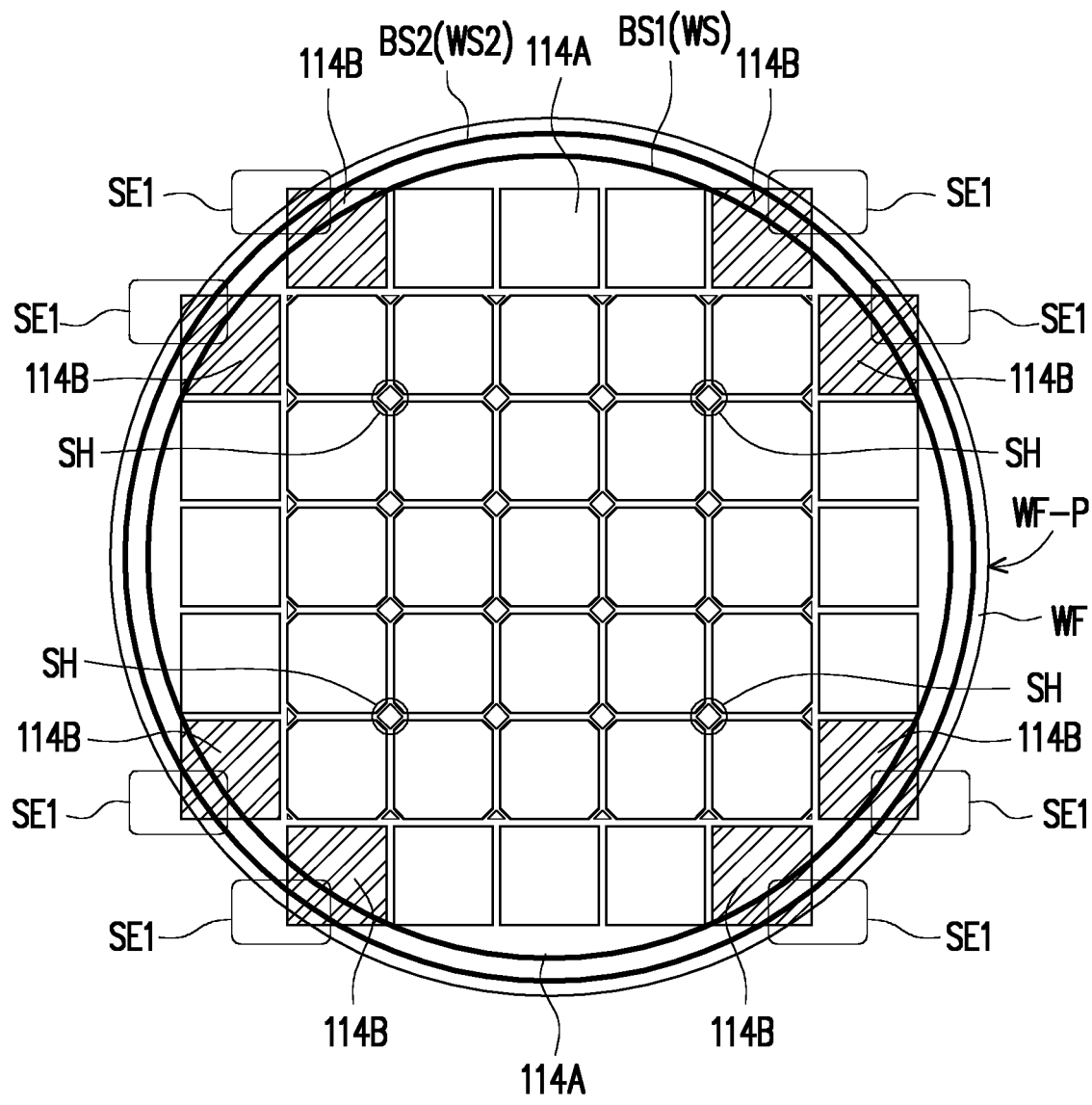
FIG. 8 is a schematic top view of a semiconductor structure according to some other exemplary embodiments of the present disclosure.

FIG. 8 is a schematic top view of a semiconductor structure according to some other exemplary embodiments of the present disclosure. The semiconductor structure S800 illustrated in FIG. 8 is similar to the semiconductor structure S700 illustrated in FIG. 7, therefore, the same reference numerals are used to refer to the same or liked parts, and its detailed description is omitted herein. Referring to FIG. 8, besides having a first barrier structure BS1 that includes one wall structure WS (or polymer wall structures PW) that is overlapped with all the second surface mount components 114B, a second barrier structure BS2 is further included. For example, the second barrier structure BS2 includes one second wall structure WS2 (or polymer wall structures PW) that is overlapped with all the plurality of second surface mount components 114B. In some embodiments, the single second wall structure WS2 is surrounding the single wall structure WS, and further surrounding all the first surface mount components 114A. Similar to the above embodiments, the semiconductor structure S800 includes a first barrier structure BS1 and a second barrier structure BS2 used to block the spreading of the second underfill UF2. As such, a risk of underfill bleeding at the wafer edge is significantly reduced.

Figure 9:
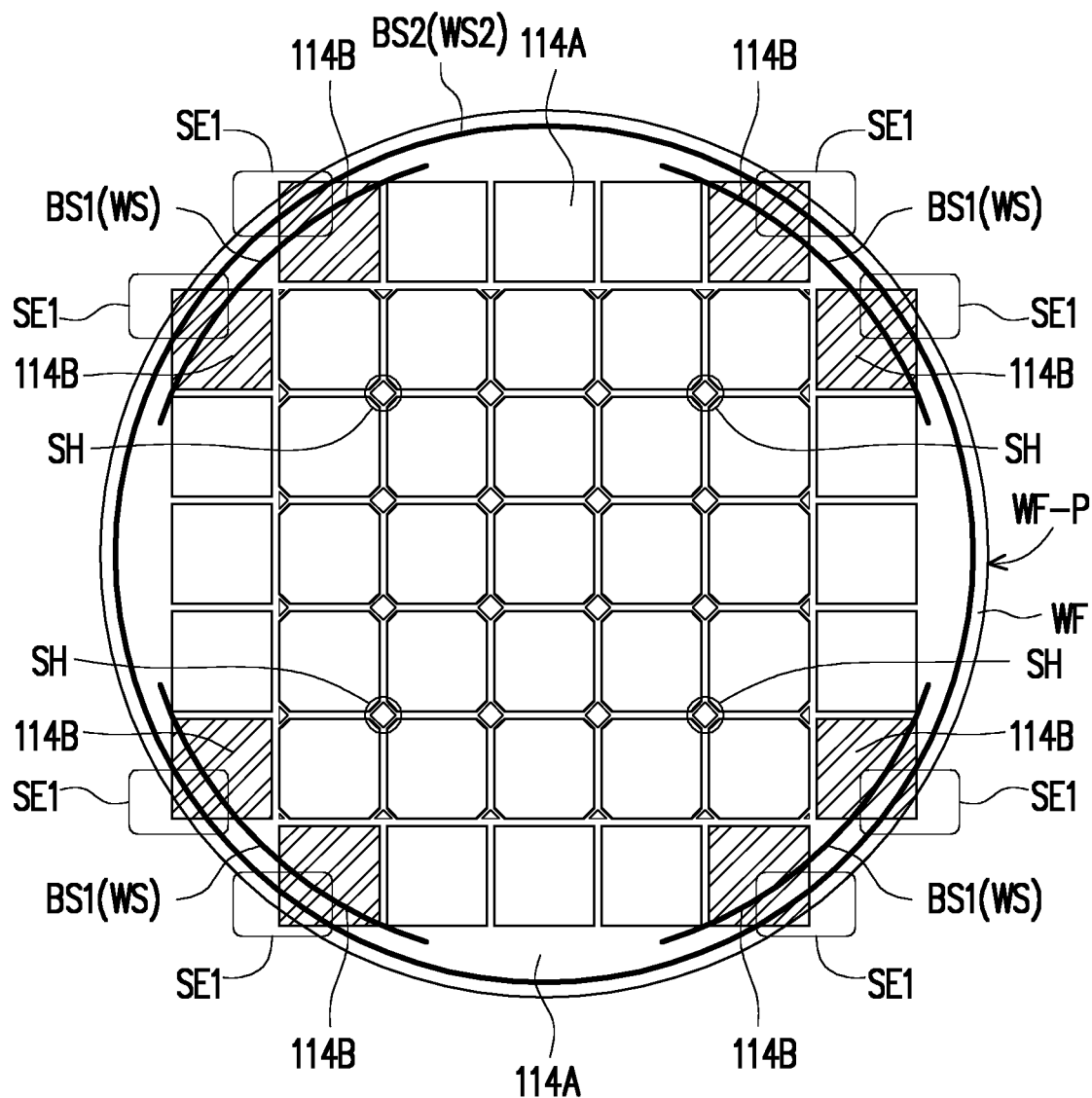
FIG. 9 is a schematic top view of a semiconductor structure according to some other exemplary embodiments of the present disclosure.

FIG. 9 is a schematic top view of a semiconductor structure according to some other exemplary embodiments of the present disclosure. The semiconductor structure S900 illustrated in FIG. 9 is similar to the semiconductor structure S500 illustrated in FIG. 5, therefore, the same reference numerals are used to refer to the same or liked parts, and its detailed description is omitted herein. Referring to FIG. 9, the semiconductor structure S900 includes a first barrier structure BS1 and a second barrier structure BS2. In the exemplary embodiment, the first barrier structure BS1 comprises a plurality of wall structures WS (or polymer wall structures PW) arranged in a circular fashion. For example, one of the wall structures WS (or polymer wall structures PW) is overlapped with at least two of the second surface mount components 114B. Furthermore, the second barrier structure BS2 includes one second wall structure WS2 (or polymer wall structures PW) that is overlapped with all the plurality of second surface mount components 114B. In some embodiments, the single second wall structure WS2 is surrounding the plurality of wall structure WS, and further surrounding all the first surface mount components 114A. Similar to the above embodiments, the semiconductor structure S900 includes a first barrier structure BS1 and a second barrier structure BS2 used to block the spreading of the second underfill UF2. As such, a risk of underfill bleeding at the wafer edge is significantly reduced.

Figure 10:
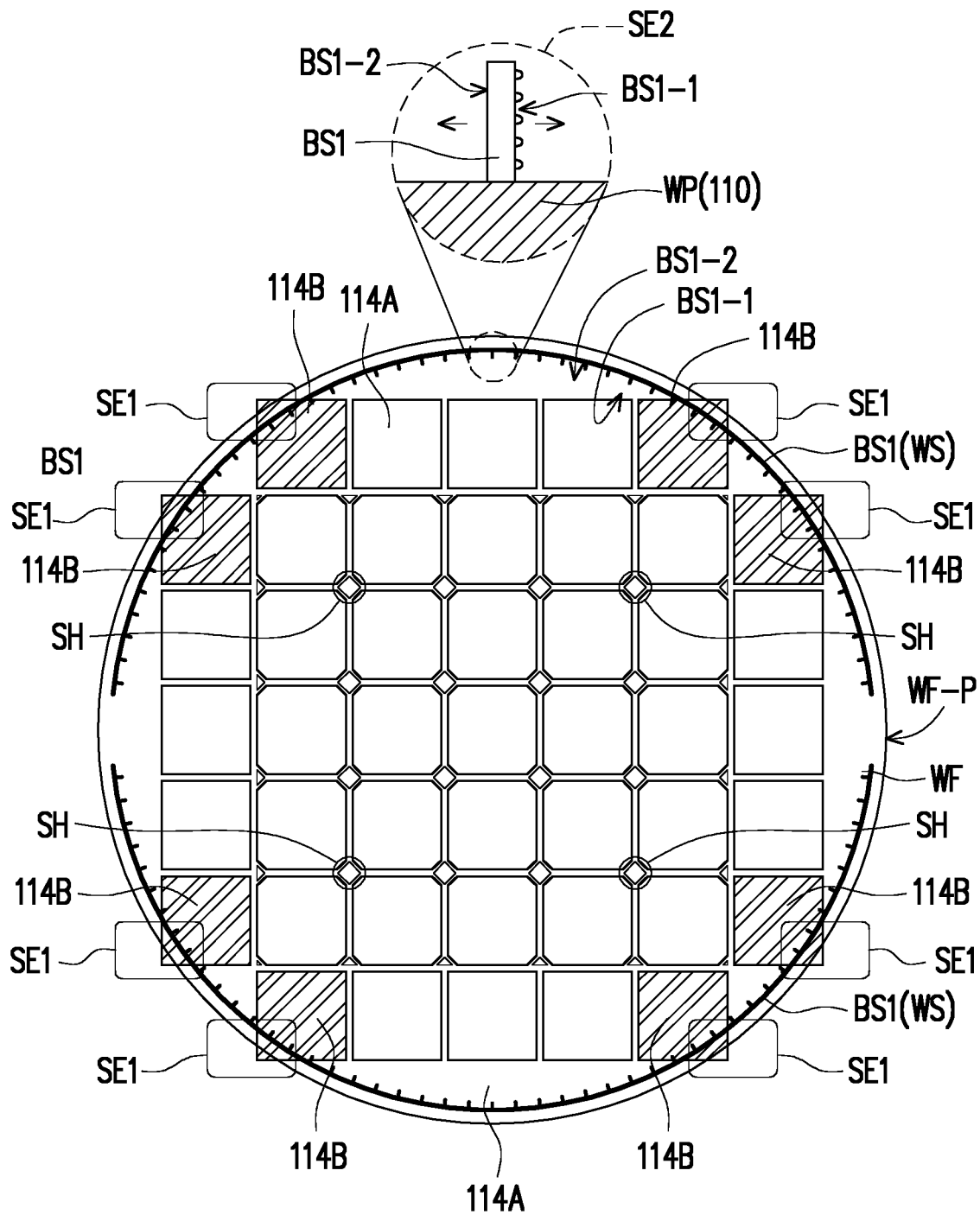
FIG. 10 is a schematic top view of a semiconductor structure according to some other exemplary embodiments of the present disclosure.

FIG. 10 is a schematic top view of a semiconductor structure according to some other exemplary embodiments of the present disclosure. The semiconductor structure S1000 illustrated in FIG. 10 is similar to the semiconductor structure S500 illustrated in FIG. 5, therefore, the same reference numerals are used to refer to the same or liked parts, and its detailed description is omitted herein. Referring to FIG. 10, the first barrier structure BS1 includes two wall structures WS (or polymer wall structures PW) arranged in a circular fashion. For example, one of the wall structures WS (or polymer wall structures PW) is overlapped with four of the second surface mount components 114B. Furthermore, from an enlarged sectional view of a section SE2, the first barrier structure BS1 has a first surface BS1-1 facing the center of the semiconductor wafer WF, and a second surface BS1-2 facing away from the center of the semiconductor wafer WF, or is facing the periphery WF-P of the semiconductor wafer WF. In some embodiments, the first surface BS1-1 of the first barrier structure BS1 is an irregular surface having a plurality of protrusions, whereas the second surface BS1-2 of the first barrier structure BS1 is a substantially planar surface. Similar to the above embodiments, the semiconductor structure S1000 includes a first barrier structure BS1 used to block the spreading of the second underfill UF2. As such, a risk of underfill bleeding at the wafer edge is significantly reduced.

In the above-mentioned embodiments, the semiconductor structure includes first and second surface mount components disposed on the semiconductor wafer, whereby an edge of the second surface mount component is overhanging a periphery of the semiconductor wafer. Since the first barrier structure is disposed on the semiconductor wafer in between the second electrical connectors and an edge of the second surface mount components, the spread of the second underfill covering the second electrical connectors will be hindered by the first barrier structure. As such, a risk of underfill bleeding at the wafer edge is significantly reduced, and there is no need for visual inspection of underfill bleeding at the wafer edge. Overall, a semiconductor structure with improved reliability is obtained.

In accordance with some embodiments of the present disclosure, a semiconductor structure includes a semiconductor wafer, a first surface mount component, a second surface mount component and a first barrier structure. The first surface mount component is disposed on the semiconductor wafer, and electrically connected to the semiconductor wafer through a plurality of first electrical connectors. The second surface mount component is disposed on the semiconductor wafer, and electrically connected to the semiconductor wafer through a plurality of second electrical connectors, wherein an edge of the second surface mount component is overhanging a periphery of the semiconductor wafer. The first barrier structure is disposed on the semiconductor wafer in between the plurality of second electrical connectors and the edge of the second surface mount component, wherein a first surface of the first barrier structure is facing the plurality of second electrical connectors, and a second surface of the first barrier structure is facing away from the plurality of second electrical connectors.

In accordance with some other embodiments of the present disclosure, a semiconductor structure includes a semiconductor wafer, a plurality of first surface mount components, a plurality of second surface mount components and a first barrier structure. The semiconductor wafer includes a plurality of semiconductor dies, an insulating encapsulant and a redistribution structure. The insulating encapsulant is encapsulating the plurality of semiconductor dies. The redistribution structure is disposed on the insulating encapsulant and electrically connected to the plurality of semiconductor dies. The first surface mount components are disposed on the semiconductor wafer and electrically connected to the redistribution structure. The second surface mount components are disposed on the semiconductor wafer and electrically connected to the redistribution structure, wherein each of the plurality of second surface mount components has a protruded region which protrudes out from a periphery of the semiconductor wafer. The first barrier structure is disposed in between the plurality of second surface mount components and the redistribution structure of the semiconductor wafer.

In accordance with yet another embodiment of the present disclosure, a method of fabricating a semiconductor structure is described. The method includes the following steps. A carrier is provided. A plurality of semiconductor dies is disposed on the carrier. An insulating encapsulant is formed on the carrier and encapsulating the plurality of semiconductor dies. A redistribution structure is formed on the insulating encapsulant and electrically connected to the plurality of semiconductor dies. The first barrier structure is formed on the semiconductor wafer over the redistribution structure. A plurality of first surface mount components is provided on the semiconductor wafer, wherein the plurality of first surface mount components is electrically connected to the redistribution structure. A plurality of second surface mount components is provided on the semiconductor wafer and electrically connected to the redistribution structure, wherein each of the plurality of second surface mount components has a protruded region which protrudes out from a periphery of the semiconductor wafer, and the first barrier structure is disposed in between the plurality of second surface mount components and the redistribution structure of the semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor wafer;
   bonding a plurality of first surface mount components and a plurality of second surface mount components onto the semiconductor wafer, wherein a first portion of each of the plurality of second surface mount components is overhanging a periphery of the semiconductor wafer;
   forming a first barrier structure in between the plurality of second surface mount components and the semiconductor wafer; and
   forming an underfill structure under a second portion of each of the plurality of second surface mount components, wherein the first barrier structure blocks the spreading of the underfill structure from the second portion to the first portion.

2. The method according to claim 1, wherein the first barrier structure is formed by printing or dispending a polymer material on the semiconductor wafer to form a polymer wall structure.

3. The method according to claim 1, wherein the first barrier structure is formed by:
   forming a plurality of conductive elements on dummy pads of the semiconductor wafer;
   performing a reflow process so that the plurality of conductive elements is merged to form a plurality of connecting elements joining the plurality of conductive elements together, and wherein the plurality of conductive elements and the plurality of connecting elements together constitute the first barrier structure.

4. The method according to claim 3, wherein the underfill structure is formed to cover a first surface of the plurality of connecting elements, while revealing a second surface of the plurality of connecting elements opposite to the first surface.

5. The method according to claim 1, wherein the semiconductor wafer is formed by:
   disposing a plurality of semiconductor dies on a carrier;
   forming an insulating encapsulant on the carrier encapsulating the plurality of semiconductor dies; and
   forming a redistribution structure on the insulating encapsulant and electrically connected to the plurality of semiconductor dies.

6. The method according to claim 1, wherein the first barrier structure is formed so that it extends beyond a periphery of the plurality of second surface mount components.

7. The method according to claim 1, wherein bonding the plurality of second surface mount components onto the semiconductor wafer comprises pressing the plurality of second surface mount components on the first barrier structure, and so that the first barrier structure is deformed to lean against sidewalls of the plurality of second surface mount components.

8. A method, comprising:
   disposing a plurality of semiconductor dies on a carrier;
   forming a redistribution structure on the plurality of semiconductor dies and forming a plurality of conductive pads on a top surface of the redistribution structure;
   forming a first barrier structure on the top surface of the redistribution structure; and
   mounting a plurality of surface mount components on the redistribution structure, wherein the plurality of surface mount components is electrically connected to the plurality of conductive pads through a plurality of electrical connectors, and the plurality of surface mount components is pressed on the first barrier structure, and wherein a corner portion of the plurality of surface mount components extends beyond sidewalls of the redistribution structure.

9. The method according to claim 8, further comprising forming an underfill in between the plurality of surface mount components and the top surface of the redistribution structure, wherein the underfill is uncovering the corner portion of the plurality of surface mount components.

10. The method according to claim 8, wherein forming the first barrier structure comprises printing or dispending a polymer material on the semiconductor wafer to form a polymer wall structure on the top surface of the redistribution structure.

11. The method according to claim 8, wherein after the plurality of surface mount components is pressed on the first barrier structure, the first barrier structure is deformed to lean against sidewalls of the plurality of surface mount components.

12. The method according to claim 8, wherein the first barrier structure is formed with a first surface facing the plurality of electrical connectors, and a second surface facing away from the plurality of electrical connectors, and wherein the first surface is formed as an irregular surface having a plurality of protrusions.

13. The method according to claim 8, further comprising mounting a plurality of second surface mount components on the redistribution structure, wherein the plurality of second surface mount components is arranged to be located within an area on the top surface of the redistribution structure.

14. The method according to claim 8, further comprises forming a plurality of dummy pads on the top surface of the redistribution structure, and wherein the first barrier structure is formed on the plurality of dummy pads over the redistribution structure.

15. A method, comprising:
   providing a circular semiconductor wafer comprising a redistribution structure;
   forming a first barrier structure on the redistribution structure along a periphery of the circular semiconductor wafer;
   mounting a plurality of surface mount components on the circular semiconductor wafer, wherein a bonding surface of the plurality of surface mount components is pressed onto the first barrier structure, and the bonding surface is separated by the first barrier structure into a first section and a second section;
   forming an underfill structure between the redistribution structure and the plurality of surface mount components, wherein the underfill structure covers the first section of the bonding surface of the plurality of surface mount components while revealing the second section.

16. The method according to claim 15, wherein the first barrier structure is formed with a plurality of wall structures arranged in a circular fashion.

17. The method according to claim 16, wherein the plurality of wall structures is formed so that one of plurality of wall structures is overlapped with at least two of the plurality of surface mount components.

18. The method according to claim 15, wherein the first barrier structure is formed as one circular wall structure that is overlapped with all the plurality of surface mount components.

19. The method according to claim 15, further comprising forming a second barrier structure on the redistribution structure, wherein the second barrier structure is formed in between the first barrier structure and the periphery of the circular semiconductor wafer.

20. The method according to claim 15, wherein the first barrier structure is formed with a first surface facing and contacting the underfill structure, and a second surface facing away from the underfill structure, and wherein the first surface is formed as an irregular surface having a plurality of protrusions.

* * * * *